US012610752B2

(12) United States Patent
Zhang et al.

(10) Patent No.: US 12,610,752 B2
(45) Date of Patent: Apr. 21, 2026

(54) RESISTIVE RANDOM-ACCESS MEMORY DEVICES WITH A VIA DEVICE STRUCTURE

(71) Applicant: TetraMem Inc., Fremont, CA (US)

(72) Inventors: Minxian Zhang, Newark, CA (US); Mingche Wu, Newark, CA (US); Ning Ge, Newark, CA (US)

(73) Assignee: TetraMem Inc., San Jose, CA (US)

( * ) Notice: Subject to any disclaimer, the term of this patent is extended or adjusted under 35 U.S.C. 154(b) by 754 days.

(21) Appl. No.: 17/654,576

(22) Filed: Mar. 11, 2022

(65) Prior Publication Data

US 2023/0292635 A1     Sep. 14, 2023

(51) Int. Cl.
H10N 70/00     (2023.01)
H10B 63/00     (2023.01)
G11C 13/00     (2006.01)

(52) U.S. Cl.
CPC ........... H10N 70/826 (2023.02); H10B 63/30 (2023.02); H10B 63/80 (2023.02); H10N 70/021 (2023.02); H10N 70/063 (2023.02); H10N 70/8833 (2023.02); G11C 13/003 (2013.01); G11C 2213/15 (2013.01); G11C 2213/79 (2013.01)

(58) Field of Classification Search
CPC ........ G11C 13/003; H10N 70/231–235; H01L 2224/023–024
See application file for complete search history.

(56) References Cited

U.S. PATENT DOCUMENTS

| | | | | |
|---|---|---|---|---|
| 2012/0235112 A1* | 9/2012 | Huo | ................... | H10N 70/8833 |
| | | | | 257/4 |
| 2016/0359108 A1* | 12/2016 | Majhi | .................. | H10N 70/066 |
| 2017/0207387 A1* | 7/2017 | Yang | ...................... | H10N 70/24 |
| 2018/0165396 A1* | 6/2018 | Lin | ........................ | G06F 3/0659 |

* cited by examiner

*Primary Examiner* — Sue A Purvis
*Assistant Examiner* — Emily Farmer
(74) *Attorney, Agent, or Firm* — Jaffery Watson Hamilton & DeSanctis LLP

(57)     ABSTRACT

The present disclosure relates to resistive random-access memory (RRAM) devices. A method for fabricating an RRAM device includes: fabricating a first bottom electrode and a second bottom electrode on a substrate; fabricating a first isolation layer on the substrate, the first bottom electrode, and the second bottom electrode; fabricating a via in the first isolation layer to expose a portion of the first bottom electrode; fabricating a switching oxide layer on the first isolation layer and the exposed portion of the first bottom electrode; and fabricating a filament-forming layer by etching a portion of the switching oxide layer that extends beyond the via. The portion of the switching oxide layer does not contact the exposed portion of the first bottom electrode. A top electrode is fabricated on the filament-forming layer. A top metal interconnect may be fabricated on the top electrode and a second isolation layer.

20 Claims, 21 Drawing Sheets

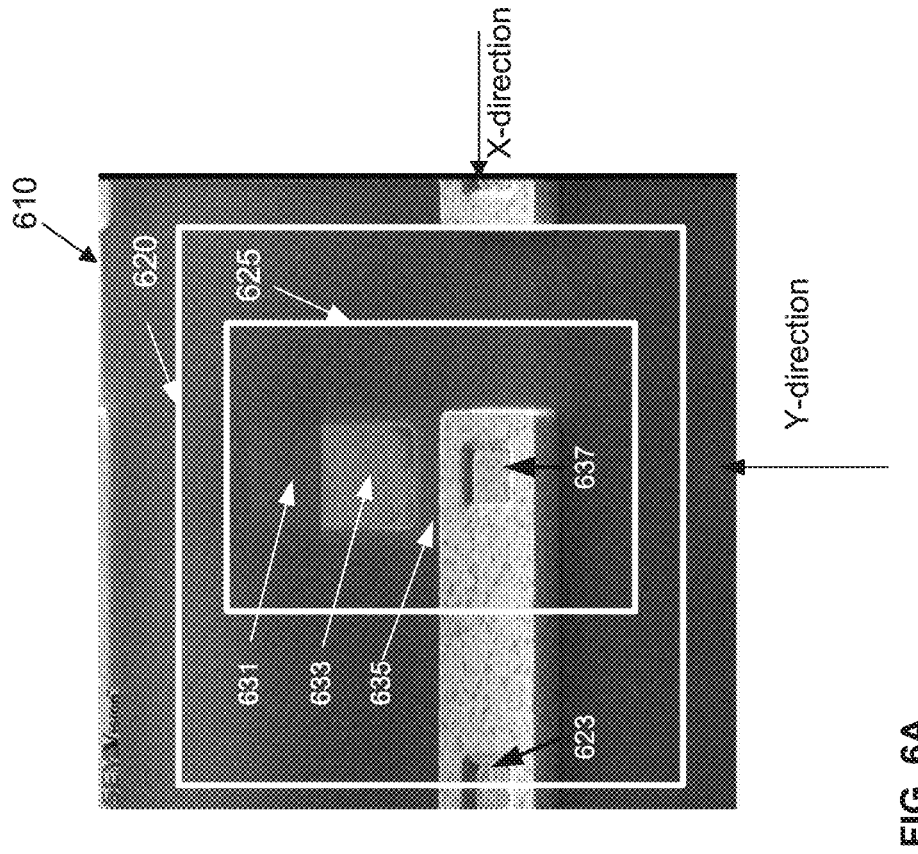
FIG. 6A
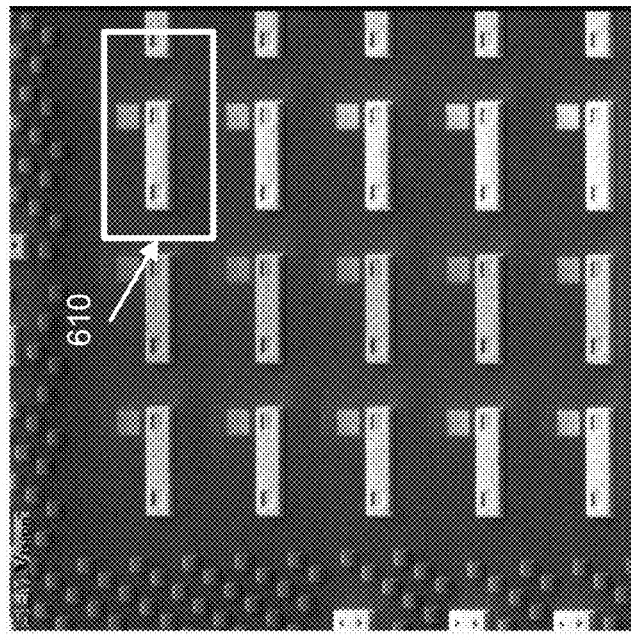

800

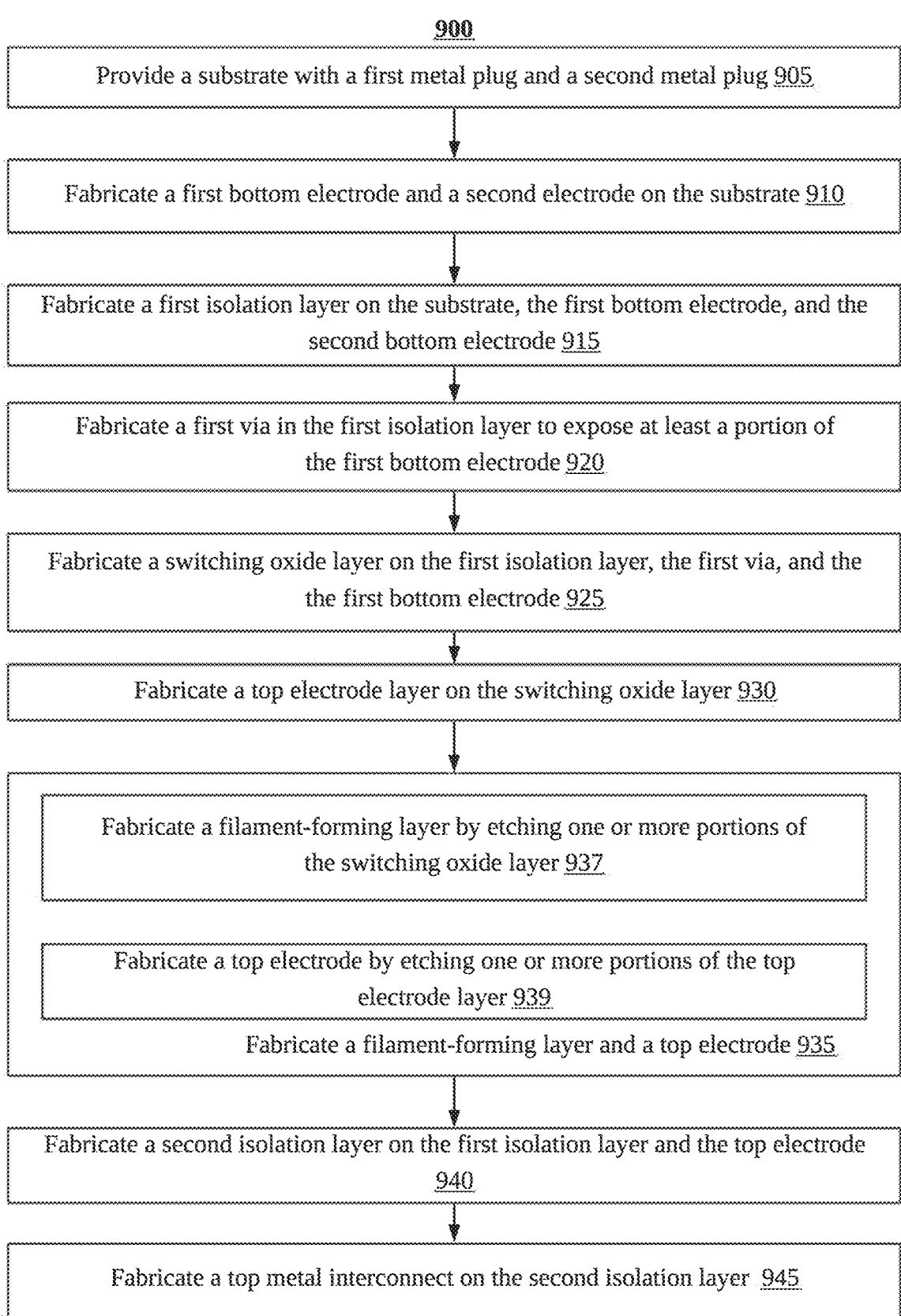

900

Provide a substrate with a first metal plug and a second metal plug 905

Fabricate a first bottom electrode and a second electrode on the substrate 910

Fabricate a first isolation layer on the substrate, the first bottom electrode, and the second bottom electrode 915

Fabricate a first via in the first isolation layer to expose at least a portion of the first bottom electrode 920

Fabricate a switching oxide layer on the first isolation layer, the first via, and the the first bottom electrode 925

Fabricate a top electrode layer on the switching oxide layer 930

Fabricate a filament-forming layer by etching one or more portions of the switching oxide layer 937

Fabricate a top electrode by etching one or more portions of the top electrode layer 939

Fabricate a filament-forming layer and a top electrode 935

Fabricate a second isolation layer on the first isolation layer and the top electrode 940

Fabricate a top metal interconnect on the second isolation layer 945

FIG. 9

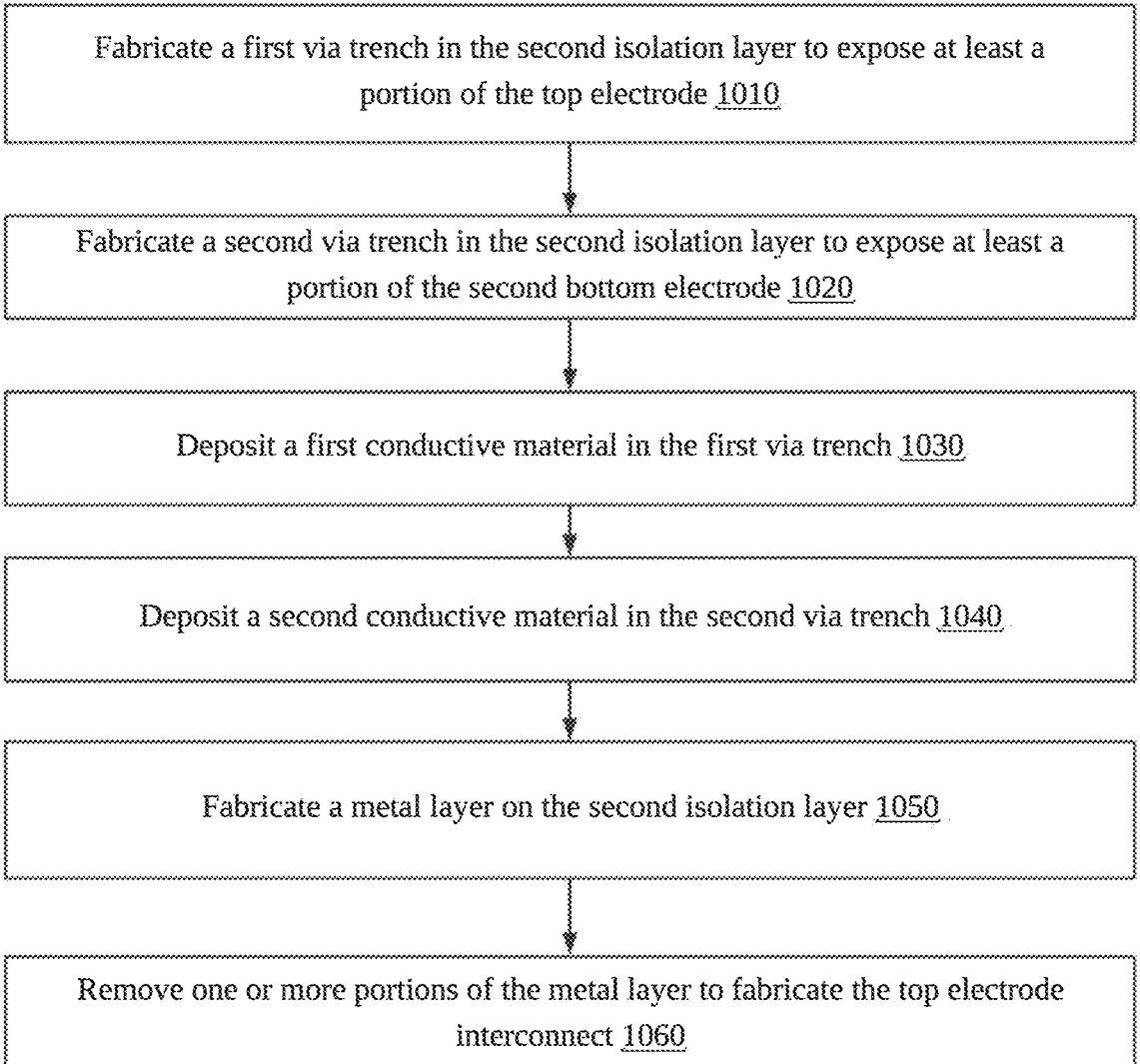

1000

Fabricate a first via trench in the second isolation layer to expose at least a portion of the top electrode 1010

Fabricate a second via trench in the second isolation layer to expose at least a portion of the second bottom electrode 1020

Deposit a first conductive material in the first via trench 1030

Deposit a second conductive material in the second via trench 1040

Fabricate a metal layer on the second isolation layer 1050

Remove one or more portions of the metal layer to fabricate the top electrode interconnect 1060

FIG. 10

RESISTIVE RANDOM-ACCESS MEMORY DEVICES WITH A VIA DEVICE STRUCTURE

TECHNICAL FIELD

The implementations of the disclosure relate generally to resistive random-access memory (RRAM) devices and, more specifically, to RRAM devices with a via device structure.

BACKGROUND

A resistive random-access memory (RRAM) device is a two-terminal passive device with tunable and non-volatile resistance. The resistance of the RRAM device may be electrically switched between a high-resistance state (HRS) and a low-resistance state (LRS) by applying suitable programming signals to the RRAM device. RRAM devices may be used to form crossbar arrays that may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with one or more aspects of the present disclosure, a resistive random-access memory (RRAM) device is provided. The RRAM device may include: a first bottom electrode fabricated on a substrate; a first isolation layer fabricated on the substrate and the first bottom electrode; a filament-forming layer fabricated on the first bottom electrode and the first isolation layer; and a top electrode fabricated on the filament-forming layer. The filament-forming layer includes at least one switching metal oxide. A first portion of the filament-forming layer is fabricated on a top surface of the first isolation layer. A second portion of the filament-forming layer is fabricated in a first via positioned in the first isolation layer. A via bottom of the first via contacts the first bottom electrode. The first portion of the filament-forming layer does not contact the first bottom electrode.

In some embodiments, the RRAM device further includes: a second bottom electrode and a top metal interconnect coupled to the top electrode and the second bottom electrode.

In some embodiments, a first portion of the top electrode is fabricated in a second via and a second portion of the top electrode extends beyond the second via.

In some embodiments, the RRAM device further includes a third via connecting the top metal interconnect and the top electrode; and a fourth via connecting the top metal interconnect and the second bottom electrode.

In some embodiments, the RRAM device further includes a second isolation layer fabricated on the top electrode and the first isolation layer. The second isolation layer includes SiO2.

In some embodiments, the switching metal oxide includes at least one of $HfO_x$, $TaO_x$, $TiO_x$, $NbO_x$, $ZrO_x$.

In some embodiments, a filament is formed within the second portion of the filament-forming layer in response to a voltage applied to the RRAM device.

In some embodiments, the first metal plug and the filament-forming layer are not centrally aligned.

In some embodiments, the first isolation layer includes SiO2.

In some embodiments, the first bottom electrode includes at least one of platinum (Pt), palladium (Pd), iridium (Jr), titanium nitride (TiN), tantalum nitride (TaN).

In some embodiments, the first bottom electrode further includes a layer of tantalum (Ta), Titanium (Ti).

In some embodiments, a cell size of the RRAM device is defined by dimensions of the first via.

In accordance with one or more aspects of the present disclosure, a method for fabricating an RRAM device is provided. The method includes: fabricating a first bottom electrode and a second bottom electrode on a substrate; fabricating a first isolation layer on the substrate, the first bottom electrode, and the second bottom electrode; fabricating a first via in the first isolation layer to expose a portion of the first bottom electrode; fabricating a switching oxide layer on the first isolation layer and the exposed portion of the first bottom electrode; and fabricating a filament-forming layer by etching the first portion of the switching oxide layer. In some embodiments, a first portion of the switching oxide layer is fabricated on a top surface of the first isolation layer. A second portion of the switching oxide layer is fabricated on the exposed portion of the first bottom electrode.

In some embodiments, the second portion of the switching oxide layer is not etched during the fabricating of the filament-forming layer.

In some embodiments, the method further includes fabricating a top electrode layer on the switching oxide layer; and fabricating a top electrode by etching a first portion of the top electrode layer, wherein the first portion of the top electrode layer is fabricated on the first portion of the switching oxide layer, and wherein the first portion of the top electrode layer does not contact the second portion of the switching oxide layer.

In some embodiments, the method further includes fabricating a second isolation layer on the first isolation layer and the top electrode; and fabricating a top metal interconnect on the second isolation layer, wherein the top metal interconnect includes a via that connects the top metal interconnect and the top electrode and a via that connects the top metal interconnect and the second bottom electrode.

In some embodiments, fabricating the top metal interconnect includes: fabricating a first via trench to expose at least a portion of the top electrode; and depositing a first conductive material in the first via trench.

In some embodiments, fabricating the top metal interconnect further includes: fabricating a second via trench to expose at least a portion of the second bottom electrode; and depositing a second conductive material in the second via trench.

In some embodiments, fabricating the top metal interconnect further includes: depositing a metal layer on the second isolation layer, the third via, and the fourth via; and removing at least a portion of the metal layer to fabricate the top metal interconnect.

In some embodiments, fabricating the first bottom electrode includes depositing a layer of at least one of platinum (Pt), palladium (Pd), iridium (Jr), titanium nitride (TiN), tantalum nitride (TaN).

In some embodiments, fabricating the first bottom electrode further includes depositing a layer of tantalum (Ta), Titanium (Ti).

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIG. 6A shows an image of a crossbar circuit in accordance with some embodiments of the present disclosure.

FIG. 9 is a flowchart illustrating an example process for fabricating an RRAM device in accordance with some embodiments of the present disclosure.

FIG. 10 is a flowchart illustrating an example process for fabricating a top metal interconnect of an RRAM device in accordance with some embodiments of the present disclosure.

DETAILED DESCRIPTION

Figure 1:
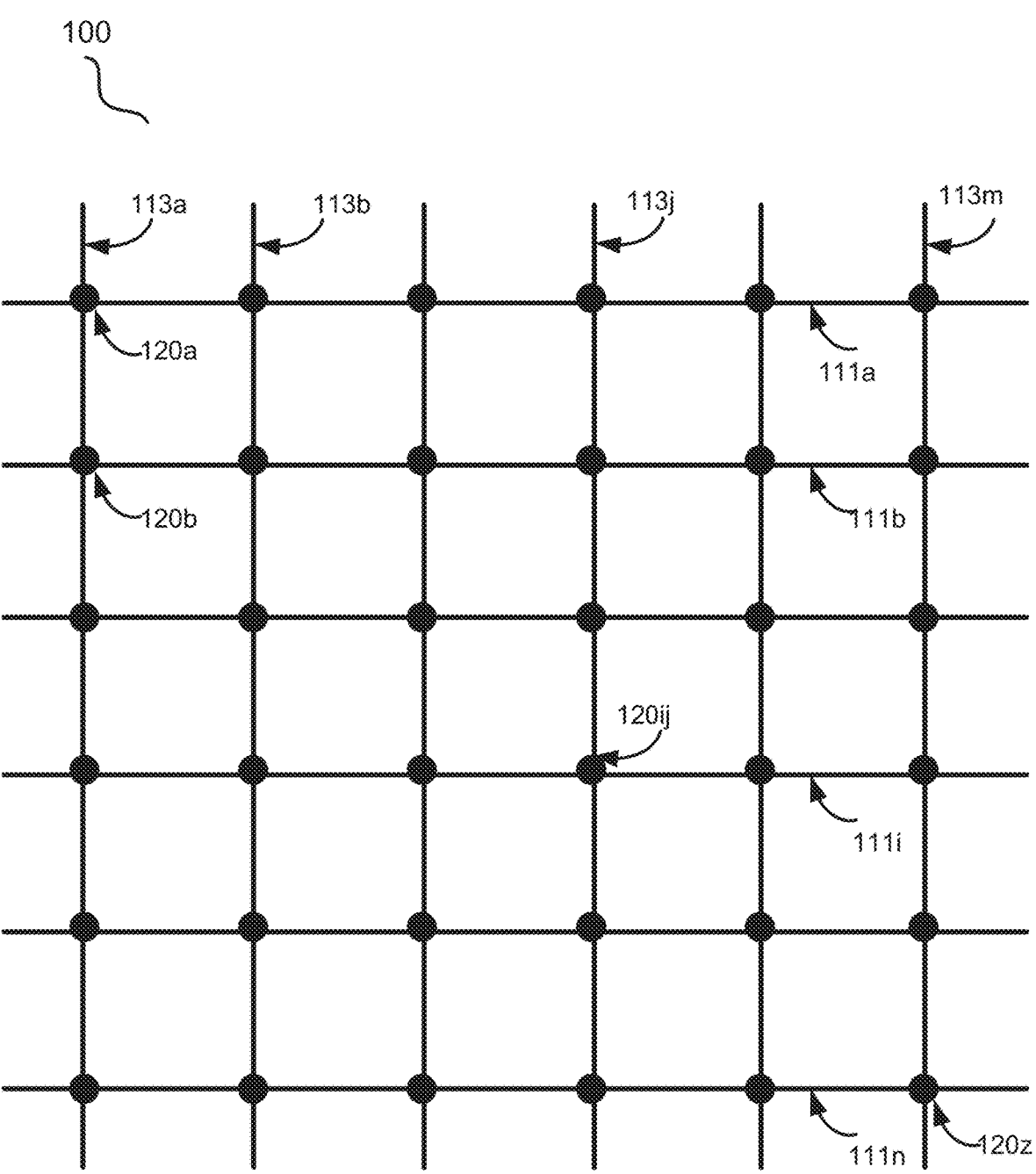
FIG. 1 is a schematic diagram illustrating an example of a crossbar circuit in accordance with some implementations of the disclosure.

Aspects of the disclosure provide resistive random-access memory (RRAM) devices and methods for fabricating the RRAM devices. An RRAM device is a two-terminal passive device with tunable resistance. The RRAM device may include a bottom electrode, a top electrode, and a switching oxide layer fabricated between the bottom electrode and the top electrode. The bottom electrode may include a nonreactive metal, such as platinum (Pt), palladium (Pd), etc. The top electrode may include a reactive metal, such as tantalum (Ta). The electrode including the nonreactive metal is also referred to herein as the "nonreactive electrode." The switching oxide layer may include a transition metal oxide, such as hafnium oxide ($HfO_x$) or tantalum oxide ($TaO_x$). The RRAM device may be in an initial state or virgin state and may have an initial high resistance before it is subject to an electrical simulation (e.g., a voltage or current signal applied to the RRAM device). The RRAM device may be tuned to a lower resistance state from the virgin state via a forming process or from a high-resistance state (HRS) to a lower resistance state (LRS) via a setting process. The forming process may refer to programming a device starting from the virgin state. The setting process may refer to programming a device starting from the high resistance state (HRS). After the reactive metal electrode being deposited on the switching oxide, the reactive metal can absorb oxygen from the switching oxide layer and create oxygen vacancies in the switching oxide layer, and oxygen ions can migrate in the switching oxide through a vacancy mechanism. During a forming process, a suitable programming signal (e.g., a voltage or current signal) may be applied to the RRAM device, which may cause a drift of oxygen ions to migrate from the switching oxide to the reactive electrode. As a result, a conductive channel or filament may form through the switching oxide layer (e.g., from the reactive electrode to the non-reactive electrode). The RRAM device may then be reset to a high-resistance state by applying a reset signal (e.g., a voltage signal, a current signal) to the RRAM device. The application of the reset signal to the RRAM device may cause oxygen ions to migrate back to the switching oxide layer and may thus interrupt the conductive filament. The RRAM device may be electrically switched between a high-resistance state and a low-resistance state by applying suitable programming signals (e.g., voltage signals, current signals, etc.) to the RRAM device. In a crossbar array circuit, the programming signals may be provided to the designated RRAM device via a selector, such as a transistor.

One of the existing approaches for fabricating an RRAM array involves fabricating bottom electrode wires, a switching oxide layer on the bottom electrode wires, and top electrode wires on the switching oxide layer. The RRAM devices are formed at each cross point of the bottom electrode wires and the top electrode wires. The size of an RRAM device fabricated using the existing approaches is thus limited by the dimensions (e.g., widths) of the bottom electrode wires and the top electrode wires. As a result, scaling down such an RRAM device may require the reduction of the dimensions of the bottom electrode wires and/or the top electrode wires and may thus increase the resistance of the bottom electrode wires and the top electrode wires. The high wire resistance may act as a voltage divider and may reduce the voltage available to an RRAM device during its operation.

To address the aforementioned and other deficiencies of the conventional RRAM devices, the present disclosure provides mechanisms for fabricating RRAM devices with a via structure that may enhance the performance of the RRAM devices and implement low-power IMC applications. In accordance with some embodiments of the present disclosure, fabricating an RRAM device may involve providing a substrate with a first metal plug and a second metal plug. The first metal plug and the second metal plug may be embedded in the substrate. A first bottom electrode and a second bottom electrode may be fabricated on the first metal plug and the second metal plug, respectively. A first isolation layer may be fabricated on the substrate, the first bottom electrode, and the second bottom electrode. The first isolation layer may include, for example, a $SiO_2$ layer. A first via may be fabricated in the first isolation layer to expose a portion of the first bottom electrode. A switching oxide layer may be fabricated on the first isolation layer and the exposed portion of the first bottom electrode. Fabricating the switching oxide layer may involve depositing one or more suitable switching metal oxides (e.g., $HfO_x$, $TaO_x$, $TiO_x$, $NbO_x$, $ZrO_x$, etc.) on the entire surface of the substrate (including the exposed portion of the first electrode), the first isolation layer, and along the sidewalls of the first via. A first portion of the switching oxide layer may be fabricated on the top surface of the first isolation layer and may extend beyond the first via. A second portion of the switching oxide layer is fabricated on the exposed portion of the first bottom electrode and may partially fill the first via. The switching oxide layer may be an ultra-thin layer of the switching metal oxide(s) (e.g., a layer about or thinner than 2 nm). Due to the ultra-thin thickness of the switching oxide layer, the unfilled portion of the first via may constitute a second via. The first portion of the switching oxide layer may correspond to the portion(s) of the switching oxide layer that extend beyond the first via. The first portion of the switching oxide layer does not contact the first bottom electrode. Since only the second portion of the switching oxide is in contact with the exposed first bottom electrode, the device size is determined by the size of the via bottom of the first via.

A top electrode layer may then be fabricated on the switching oxide layer, for example, by depositing one or more reactive metallic materials on the switching oxide layer, along the sidewalls of the second via, and over the entire top surface of first isolation materials. A top electrode and a filament-forming layer may be fabricated by selectively removing portions of the top electrode layer and the filament-forming layer, respectively. For example, a portion of the top electrode layer that extends beyond the second via may be etched to fabricate the top electrode. The first portion of the switching oxide layer may be etched to fabricate the filament-forming layer. The second portion of the switching oxide layer is not etched or otherwise modified during the fabrication of the filament-forming layer and the top electrode.

In some embodiments fabricating the RRAM device may further involve fabricating a second isolation layer on the first isolation layer and the top electrode. The second isolation layer may include a $SiO_2$ layer in some embodiments. The second isolation layer may be selectively etched to fabricate a third via and a fourth via. The first via trench may expose at least a portion of the top electrode. The second via trench may expose at least a portion of the second bottom electrode. A top metal layer may then be fabricated by depositing one or more suitable conductive materials on the second isolation layer. The top metal layer may fill the first via trench and the second via trench. A top metal interconnect may be fabricated by selectively etching the top metal layer.

As described above, the second portion of the switching oxide layer is formed on the first bottom electrode, while the other portion of the switching oxide layer does not contact the first bottom electrode. As a result, the switching metal oxides in the first portion of the filament-forming layer are not involved in the forming and switching of the device since there is no electric field across the first portion of the switching oxide layer. As such, the second portion of the switching oxide layer functions as a filament-forming region in which a filament may form during a forming process, a setting process, or a resetting process. The critical device size of the RRAM device is thus defined by the dimension of the filament-forming region and the opening size of the first via (also referred to as a via device structure) instead of the dimensions of the top electrode wires and the bottom electrode wires. Scaling down an RRAM device disclosed herein may be achieved by scaling down the size of the first via (the size of the via device structure). The RRAM device may be fabricated utilizing sub-um lithographic processes. Furthermore, during the fabrication of the filament-forming layer, the top electrode, and the top metal interconnect of the RRAM device, the filament-forming region of the RRAM device is not etched or otherwise modified. This may prevent the RRAM device from being shorted by redeposition of the etched top electrode material on the filament-forming region and performance deterioration of the RRAM device resulted from damages to the filament-forming region during the etching and post etching clean process performed on the filament-forming region. Accordingly, the techniques for fabricating RRAM devices described herein may enable efficient scaling down of RRAM devices and fabrication of a crossbar circuit by scaling down the via size of the first via. This may further control the resistance of the bottom electrode wires and the top electrode wires and the operation voltage of the RRAM devices.

FIG. 1 is a schematic diagram illustrating an example 100 of a crossbar circuit in accordance some embodiments of the present disclosure. As shown, crossbar circuit 100 may include a plurality of interconnecting electrically conductive wires, such as one or more row wires 111a, 111b, . . . , 111i, . . . , 111n, and column wires 113a, 113b, . . . , 113j, . . . , 113m for an n-row by m-column crossbar array. The crossbar circuit 100 may further include cross-point devices 120a, 120b, . . . , 120z, etc. Each of the cross-point devices may connect a row wire and a column wire. For example, the cross-point device 120ij may connect the row wire 111i and the column wire 113j. In some embodiments, crossbar circuit 100 may further include digital to analog converters (DAC, not shown), analog to digital converters (ADC, not shown), switches (not shown), and/or any other suitable circuit components for implementing a crossbar-based apparatus. The number of the column wires 113a-m and the number of the row wires 111a-n may or may not be the same.

Row wires 111 may include a first row wire 111a, a second row wire 111b, . . . , 111i, . . . , and a n-th row wire 111n. Each of row wires 111a, . . . , 111n may be and/or include any suitable electrically conductive material. In some embodiments, each row wire 111a-n may be a metal wire.

Column wires 113 may include a first column wire 113a, a second column wire 113b, . . . , and a m-th column wire 113m. Each of column wires 113a-m may be and/or include any suitable electrically conductive material. In some embodiments, each column wire 113a-m may be a metal wire.

Each cross-point device 120 may be and/or include any suitable device with tunable resistance, such as a memristor, PCM devices, floating gates, spintronic devices, RRAM, SRAM, etc. In some embodiments, one or more of cross-point devices 120 may include an RRAM device as described in connection with FIGS. 3A-5B.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance generates a current form the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as $I=VG$, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is outputted via each column wire and may be accumulated according to Kirchhoff's current law. This may enable in-memory computing (IMC) via parallel multiplications and summations performed in the crossbar arrays.

Figure 2:
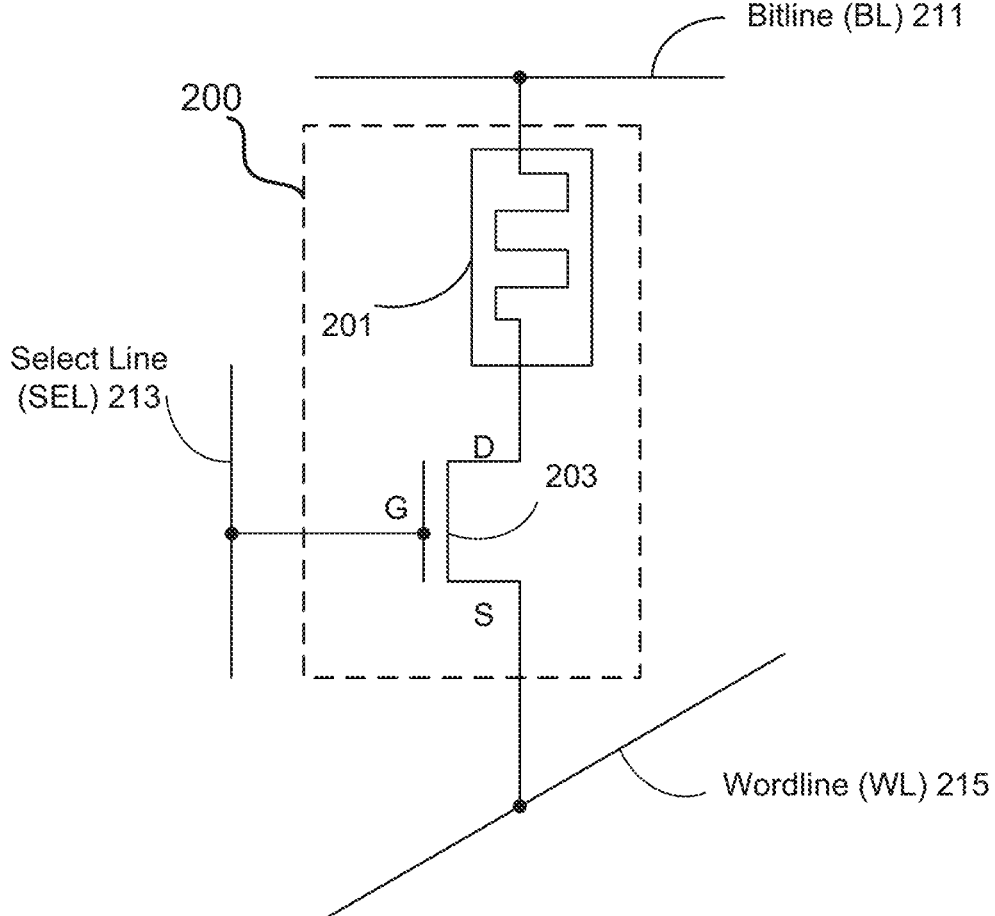
FIG. 2 is a schematic diagram illustrating an example of a cross-point device in accordance with some implementations of the disclosure.

FIG. 2 is a schematic diagram illustrating an example 200 of a cross-point device in accordance some embodiments of the present disclosure. As shown, cross-point device 200 may connect a bitline (BL) 211, a select line (SEL) 213, and a wordline (WL) 215. The bitline 211 and the wordline 215 may be a column wire and a row wire as described in connection with FIG. 1, respectively.

Cross-point device 200 may include an RRAM device 201 and a transistor 203. A transistor is a three-terminal device. The terminals of the transistors may be marked as gate (G), source (S), and drain (D), respectively. The transistor 203 may be serially connected to RRAM device 201. As shown in FIG. 2, the first electrode of the RRAM device 201 may be connected to the drain of transistor 203. The second electrode of the RRAM device 201 may be connected to the bitline 211. The source of the transistor 203 may be connected to the wordline 215. The gate of the transistor 203 may be connected to the select line 213. RRAM device 201 may include an RRAM device 300 as described in connection with FIGS. 3A-3M below. Cross-point device 200 may also be referred to as in a one-transistor-one-resistor (1T1R) configuration. The transistor 203 may perform as a selector as well as a current controller, which may set the current compliance, to the RRAM device 201 during programing. The gate voltage on transistor 203 can set current compliances to cross-point device 200 during programming and can thus control the conductance and analog behavior of cross-point device 200. For example, when cross-point device 200 is set from a high-resistance state to a low-resistance state, a set signal (e.g., a voltage signal, a current signal) may be provided via the bitline (BL) 211. Another voltage, also referred as a select voltage or gate voltage, may be applied via the select line (SEL) 213 to the transistor gate to open the gate and set the current compliance, while the wordline (WL) 215 may be set to ground. When cross-point device 200 is reset from the low-resistance state to the high-resistance state, a gate voltage may be applied to the gate of the transistor 203 via the select line 213 to open the transistor gate. Meanwhile, a reset signal may be sent to the RRAM device 201 via the wordline 215, while the bitline 211 may be set to ground. In some embodiments, the width of the bitline 211 and/or the wordline 215 may be about or greater than 1 μm.

FIGS. 3A-3M are schematic diagrams illustrating cross-sectional views of example structures 300a-1 for fabricating an example RRAM device 300 in accordance with some embodiments of the present disclosure.

Figure 3A:
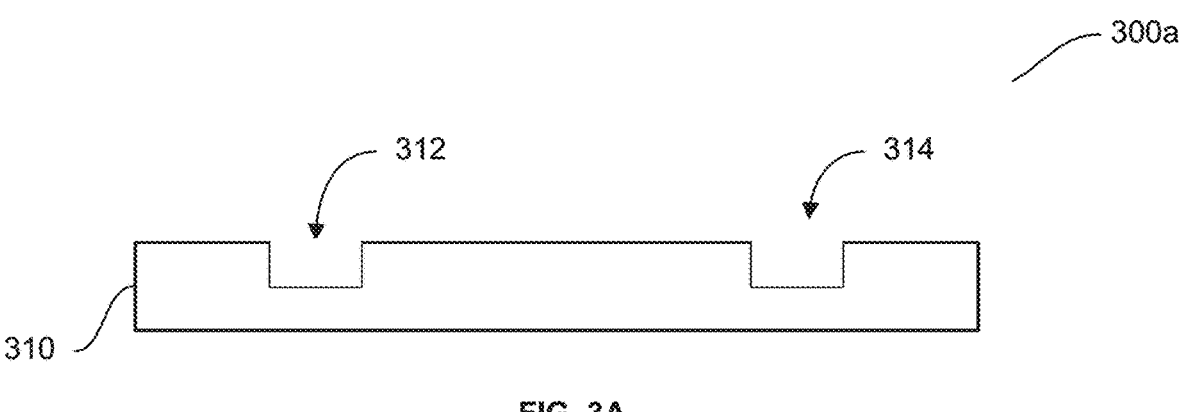
FIGS. 3A-3M illustrate cross-sectional views of example RRAM devices in accordance with some embodiments of the present disclosure.

As shown in FIG. 3A, a substrate 310 may be provided. The substrate 310 may include one or more layers of any suitable material that may serve as a substrate for an RRAM device, such as silicon (Si), silicon dioxide (SiO₂), silicon nitride (Si₃N₄), aluminum oxide (Al₂O₃), aluminum nitride (AlN), etc. In some embodiments, the substrate 310 may include diodes, transistors, interconnects, integrated circuits, etc. In some embodiments, the substrate may include a driving circuit including one or more electrical circuits (e.g., an array of electrical circuits) that may be individually controllable. In some embodiments, the driving circuit may include one or more complementary metal-oxide-semiconductor (CMOS) drivers. As illustrated in FIG. 3A, the substrate 310 may include a first opening 312 and a second opening 314. The first opening 312 and the second opening 314 do not overlap with each other.

Figure 3B:
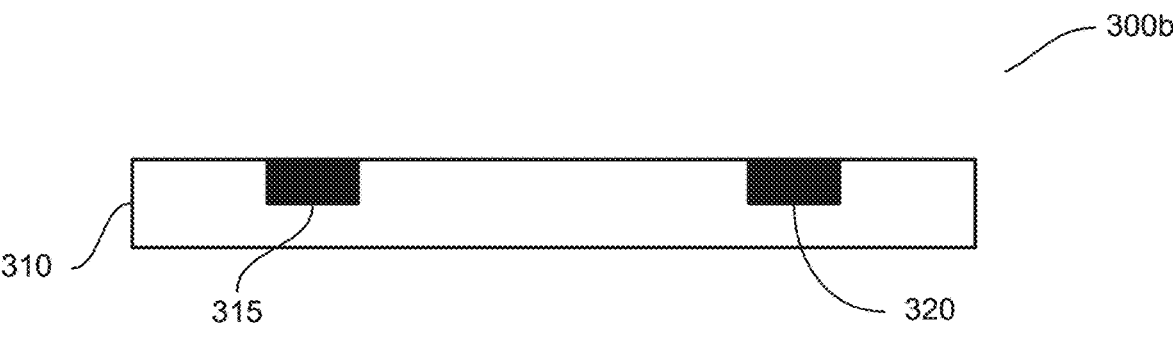

As shown in FIG. 3B, a first metal plug 315 and a second metal plug 320 may be placed in the substrate 310 by filling the first opening 312 and the second opening 314 as illustrated in FIG. 3A with a conductive material, respectively. In one implementation, the first metal plug 315 may completely fill the first opening 312. In another implementation, the first metal plug 315 may fill one or more portions of the first opening 312. The first metal plug 315 and/or the second metal plug 320 may include any suitable metal, such as Tungsten (W). The first metal plug 315 and the second metal plug 320 may be used to connect the RRAM device 300 to one or more other components of a crossbar circuit (e.g., a transistor 203 as described in FIG. 2). The first metal plug 315 and the second metal plug 320 do not overlap with each other. In some embodiments, the first metal plug 315 and the second metal plug 320 may be fabricated as part of the top metal interconnect in a CMOS substrate. The CMOS substrate may include diodes, transistors, integrated circuits, driver circuits, and other circuit components.

Figure 3C:
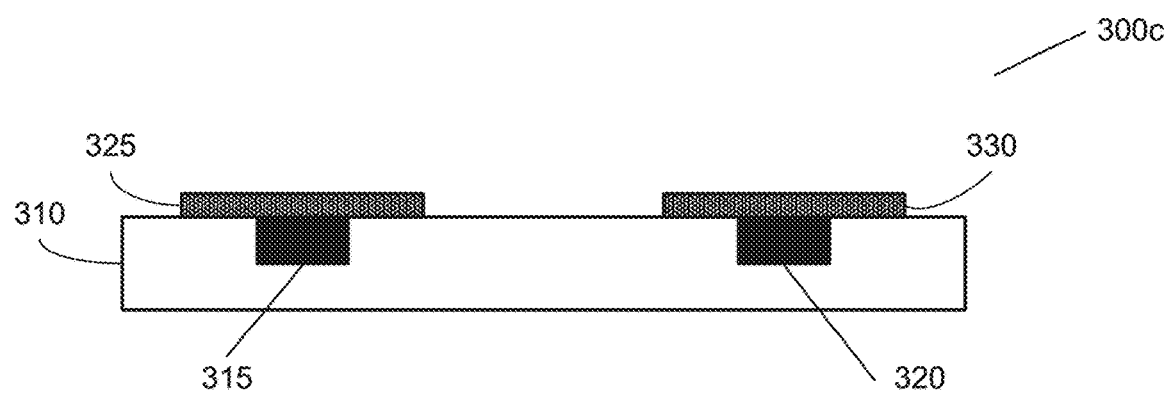

As shown in FIG. 3C, a first bottom electrode 325 and a second bottom electrode 330 may be fabricated on the substrate 310. In particular, the first bottom electrode 325 and the second bottom electrode 330 may be fabricated on the first metal plug 315 and the second metal plug 320, respectively. The first bottom electrode 325 may directly contact the first metal plug 315 to form an ohmic contact. The first bottom electrode 325 may further contact one or more portions of the substrate 310 (e.g., one or more portions of a surface of the substrate 310). The second bottom electrode 330 may directly contact the second metal plug 320 to form an ohmic contact. The second bottom electrode 330 may further contact one or more portions of the substrate 310 (e.g., one or more portions of a surface of the substrate 310). In some embodiments, the first bottom electrode 325 and/or the second bottom electrode 330 may include any suitable material that is electronically conductive and non-reactive to the switching oxide of the RRAM device described herein. Examples of the non-reactive materials may include platinum (Pt), palladium (Pd), iridium (Jr), titanium nitride (TiN), tantalum nitride (TaN), etc. The first bottom electrode 325 and the second bottom electrode 330 may or may not include the same materials. In some embodiments, the first bottom electrode 325 and/or the second bottom electrode 330 may include one or more metals that may enhance adhesion between the first bottom electrode 325 and the first metal plug 315, adhesion of the second bottom electrode 330 to the second metal plug 320, and/or adhesion of the first bottom electrode 325 and the second bottom electrode 330 to substrate 310, such as tantalum (Ta), Titanium (Ti), etc.

Figure 3D:
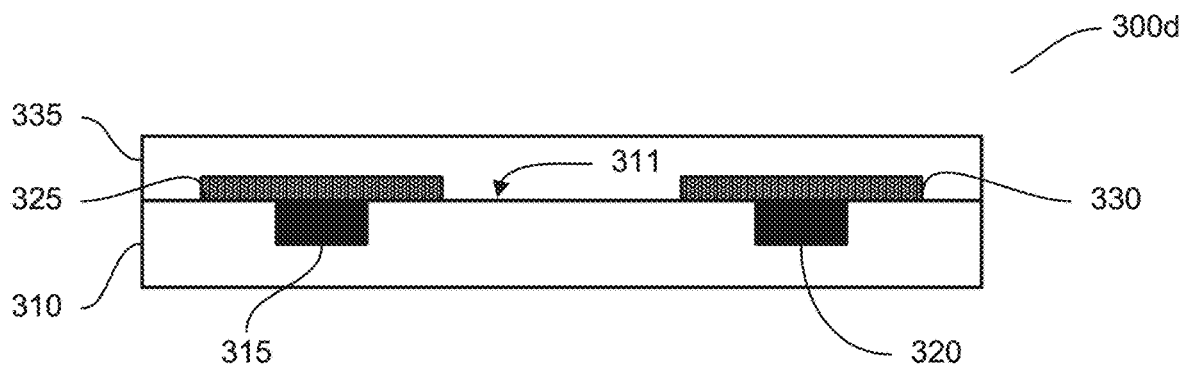

As shown in FIG. 3D, an isolation layer 335 may be fabricated on the substrate 310, the first bottom electrode 325, and the second bottom electrode 330. In one implementation, the isolation layer 335 may directly contact a top surface 311 of the substrate 310, the first bottom electrode 325, and the second bottom electrode 330. The isolation layer 335 may include any suitable material that may be used as an inter-layer dielectric (ILD) for fabricating one or more components of the RRAM device on the first bottom electrode 325 and/or the second bottom electrode 330, such as SiO₂. The ILD may be deposited on the entire top surface 311 of the substrate 310.

Figure 3E:
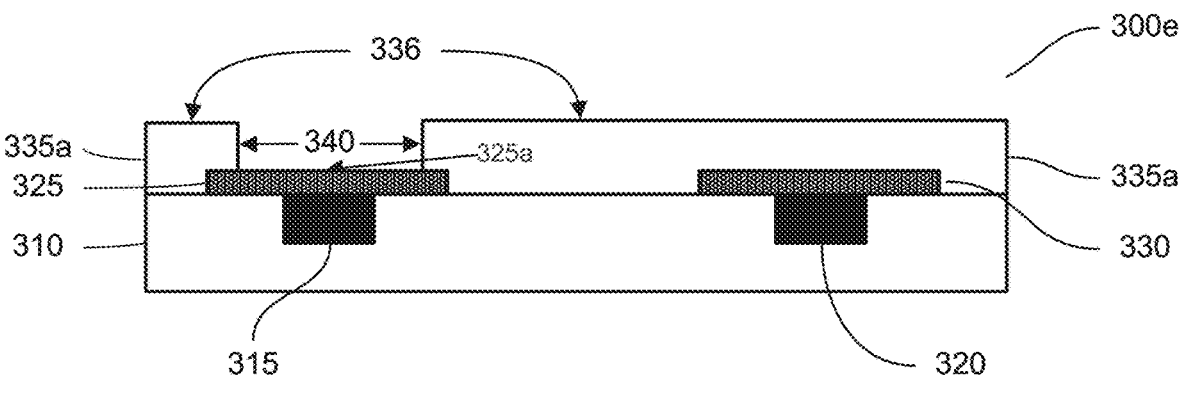
Figures 6B, 6C, 6D:
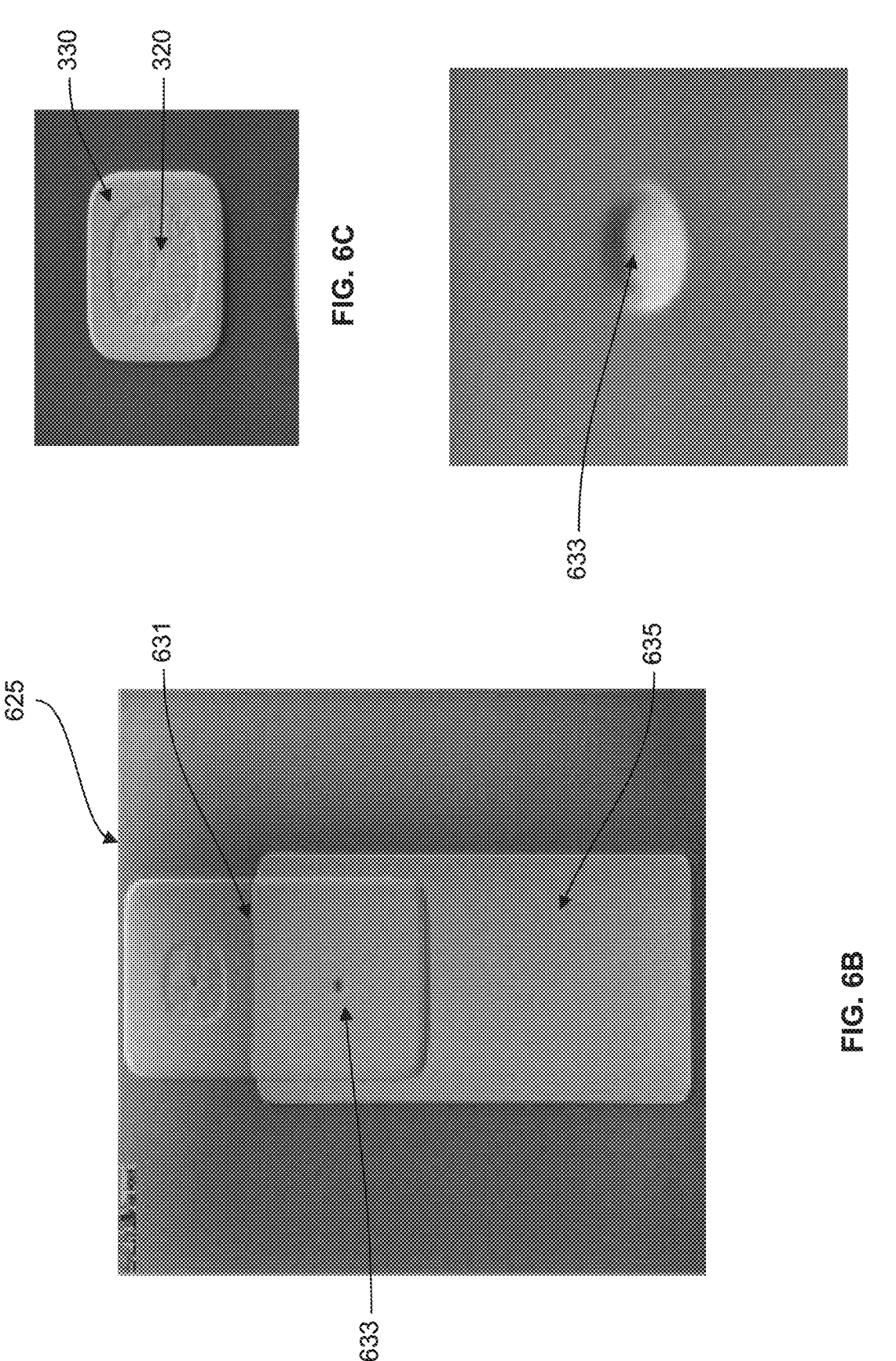
FIGS. 6B, 6C and 6D are scanning electron microscope (SEM) images of an enlarged view of the RRAM device depicted in FIG. 6A.

As shown in FIG. 3E, one or more portions of the isolation layer 335 may be selectively removed to fabricate a first via 340. The selective removal of the portion(s) of the isolation layer 335 shown in FIG. 3D may expose one or more portions 325a of the first bottom electrode 325 and may create sidewalls of the first via 340. As shown, the via bottom of the first via 340 may directly contact the exposed portion 325a of the first bottom electrode 325. Although the first via 340 is shown in the shape of a trench in FIG. 3E, the first via 340 may be circular from the top view (as shown in FIG. 6D) and the remaining portion of the isolation layer 335 (referred to herein as the isolation layer 335a) may be continuous surrounding the first via 340. Accordingly, the RRAM device described herein is also referred to as a via device. In some embodiments, a dimension (e.g., a diameter) of the first via 340 may be about or less than 1 μm.

Figure 3F:
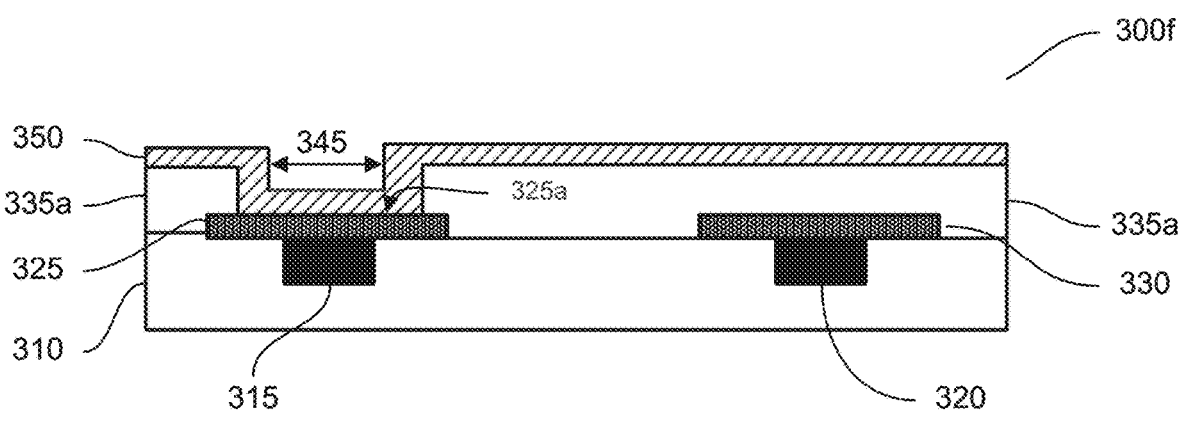

Referring to FIG. 3F, a switching oxide layer 350 may be fabricated on the isolation layer 335a and in the first via 340 shown in FIG. 3E. The switching oxide layer 350 may include one or more transition metal oxides, such as $TaO_x$, $HfO_x$, $TiO_x$, $NbO_x$, $ZrO_x$, etc., in binary oxides, ternary oxides, and high order oxides, wherein x may be used to indicate the oxide being oxygen deficient compared to its full (or terminal) oxide and the value of x may be varied from the oxygen to metal atomic ratio in the stoichiometry of its full oxide, such as x≤2.0 for $HfO_x$ (where $HfO_2$ being the full oxide), and x≤2.5 for $TaO_x$ (where $Ta_2O_5$ being the full oxide). The switching oxide layer 350 may be conformally fabricated on the top surface 336 of the first isolation layer 335a and the exposed portion 325a of the first bottom electrode 325, and along the sidewalls of the first via 340. In some embodiments, the switching oxide layer 350 may be fabricated over the entire surface 336 (as shown in FIG. 3E) of the isolation layer 335a. The fabrication of the switching oxide layer 350 may partially fill the first via 340 shown in FIG. 3E and may create a second via 345 that corresponds to the portion of the first via 340 that is not filled by the switching oxide layer 350.

Figure 3G:
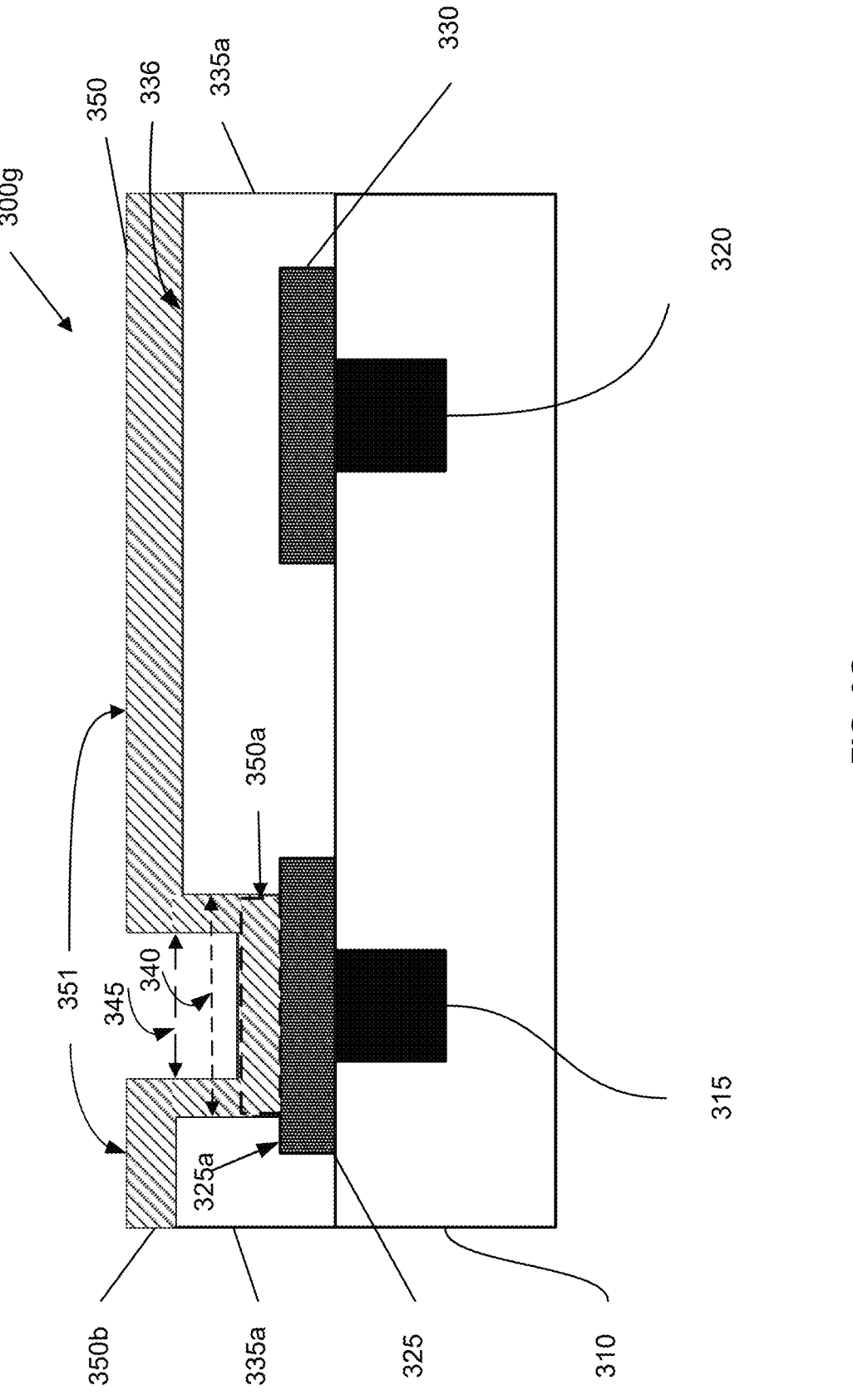

FIG. 3G illustrates the semiconductor device 300f of FIG. 3F in greater detail. As shown, a portion 350a of the switching oxide layer 350 may be fabricated on the via bottom of the first via 340 (i.e., the exposed portion 325a of the first bottom electrode 325). A portion 350b of the switching oxide layer 350 may be fabricated on the top surface 336 of the isolation layer 335a and extend beyond the first via 340 and the second via 345. The portion 350b does not contact the exposed portion 325a of the first bottom electrode 325 or the other portions of the first bottom electrode 325.

Figure 3H:
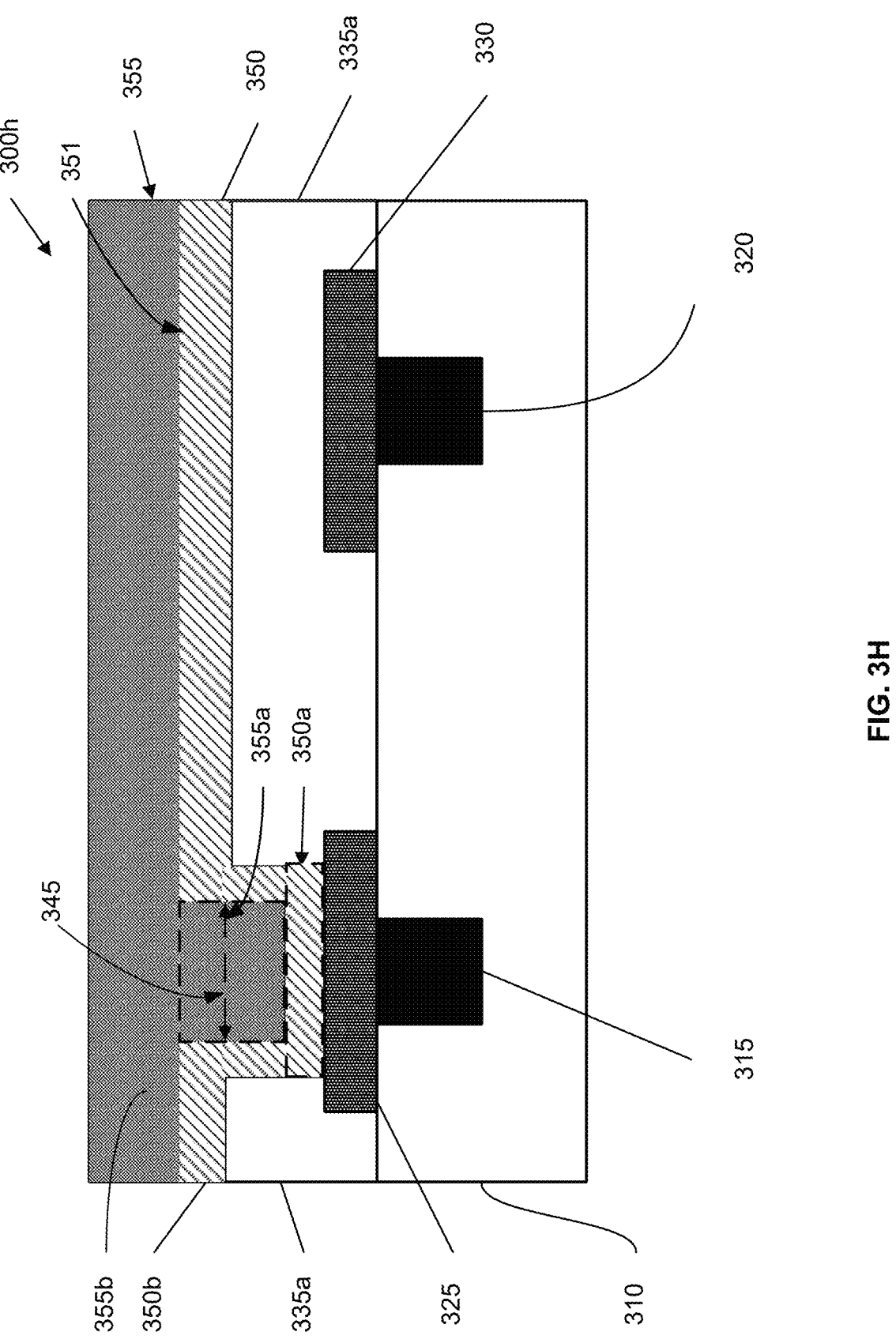

Referring to FIG. 3H, a top electrode layer 355 may be fabricated on the switching oxide layer 350. The top electrode layer 355 may include any suitable metallic material that are electronically conductive and reactive to the switching oxide in the switching oxide layer 350. For example, the top electrode layer 355 may include one or more of Ta, Hf, Ti, TiN, TaN, and the like. As illustrated in FIG. 3H, the top electrode layer 355 may include two portions, a portion of 355a and a portion of 355b. The portion 355a of the top electrode layer 355 may fill the second via 345 and may serve as a via connecting the portion 350a of the switching oxide layer 350 and the top electrode layer 355. The portion 355b of the top electrode layer 355 may be formed on a top surface 351 of the portion 350b of the switching oxide layer 350. As such, the top electrode layer 355 may be conformally fabricated on the top surface 351 of the switching oxide layer 350 and along the sidewalls of the second via 345.

Figures 3I, 3J:
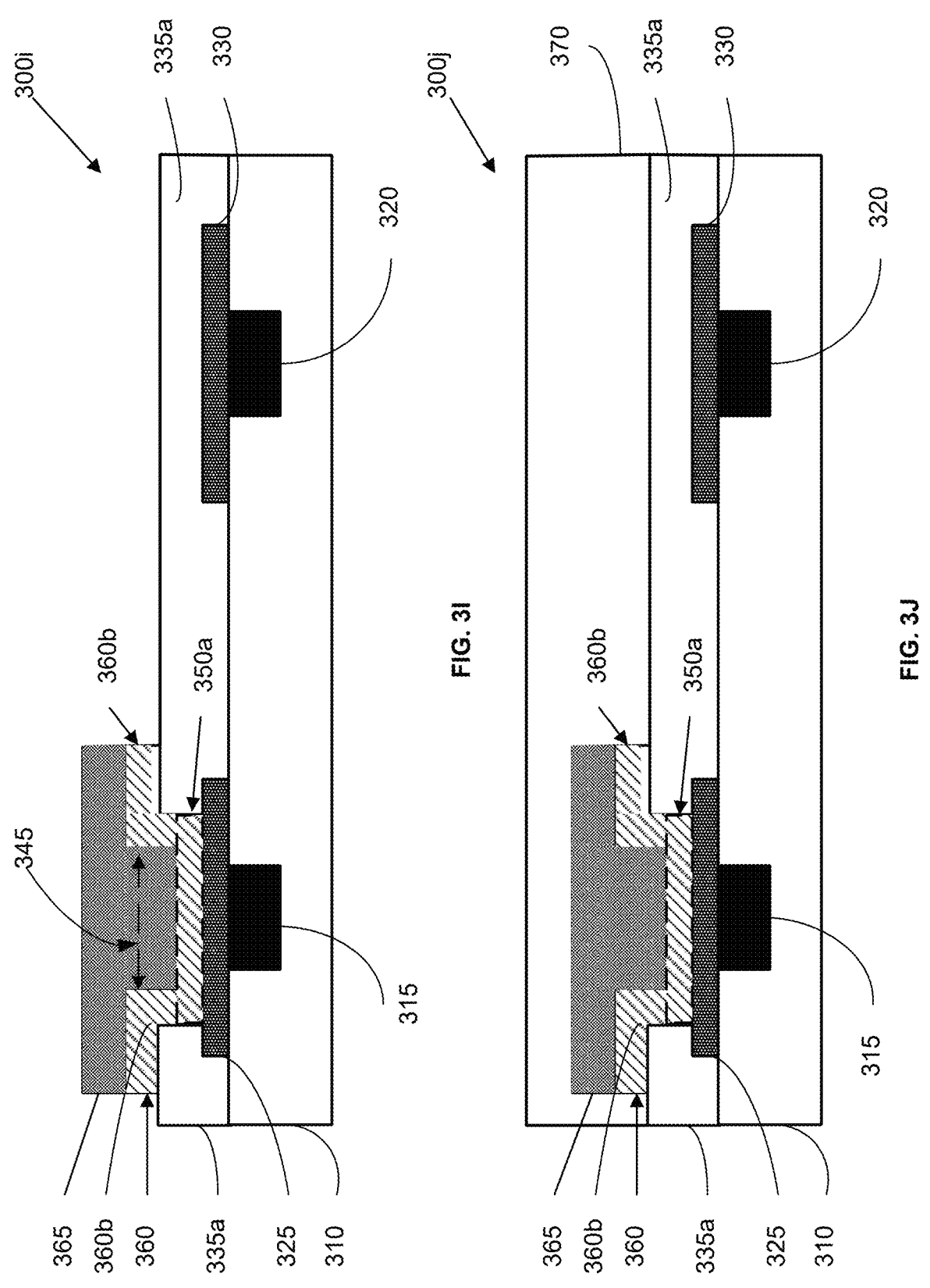

As shown in FIG. 3I, one or more portions of the switching oxide layer 350 may be selectively removed to fabricate a filament-forming layer 360. One or more portions of the top electrode layer 355 may be selectively removed to fabricate a top electrode 365. As illustrated, the filament-forming layer 360 and the top electrode 365 may fill the second via 345 and may extend beyond the region defined by the second via 345. As an example, the portion 355b of the top electrode layer 355 as shown in FIG. 3H may be partially etched to fabricate the top electrode 365 as shown in FIG. 3I. The portion 350b of the switching oxide layer 350 as shown in FIG. 3H may be partially etched to fabricate the filament-forming layer 360 as shown in FIG. 3I. In particular, the etched portion 350b may form portion 360b of the filament-forming layer 360. Since the cell size of the RRAM device is small and the filament-forming layer 360 is ultra-thin, the performance of the RRAM device may be very sensitive to the processing environment. For example, if the edge or sidewall of filament-forming layer 350 is exposed to an etching environment, the edge portion of the switching metal oxide may be affected by the etching process and the sidewall of the oxide may be shorted by the metal redeposition form the etching process. The techniques for fabricating the via device as described herein may prevent such process degradation to the device. During the etching of the top electrode layer 355, the portion 350a of the switching oxide layer 350 is not etched or otherwise modified during the fabrication of the filament-forming layer 360 and the top electrode 365. As will be discussed in greater detail below, the portion 350a may serve as a filament-forming region in which a filament may form in response to a voltage applied to the RRAM device. The fabrication of the filament-forming layer 360 without etching the portion 350a of the switching oxide layer 350 and the portion 355a of the top electrode layer 355 may avoid device degradation resulted from the etching process. For example, the etching of 355b and 350b during the fabrication of the RRAM device may cause redeposition of the etched top electrode material on the portion 360b. However, this does not result in performance deterioration of the RRAM device given that the portion 360b is not the filament-forming region of the RRAM device and that the filament-forming region 350a is not affected by the etching process.

As shown in FIG. 3J, an isolation layer 370 may be fabricated on the isolation layer 335a and the top electrode 365. The isolation layer 370 may contact one or more sidewalls of the filament-forming layer 360 and one or more sidewalls of the top electrode 365. In some embodiments, the isolation layer 370 may include any suitable material that may be used as an inter-layer dielectric for fabricating one or more components of the RRAM device, such as $SiO_2$.

Figure 3K:
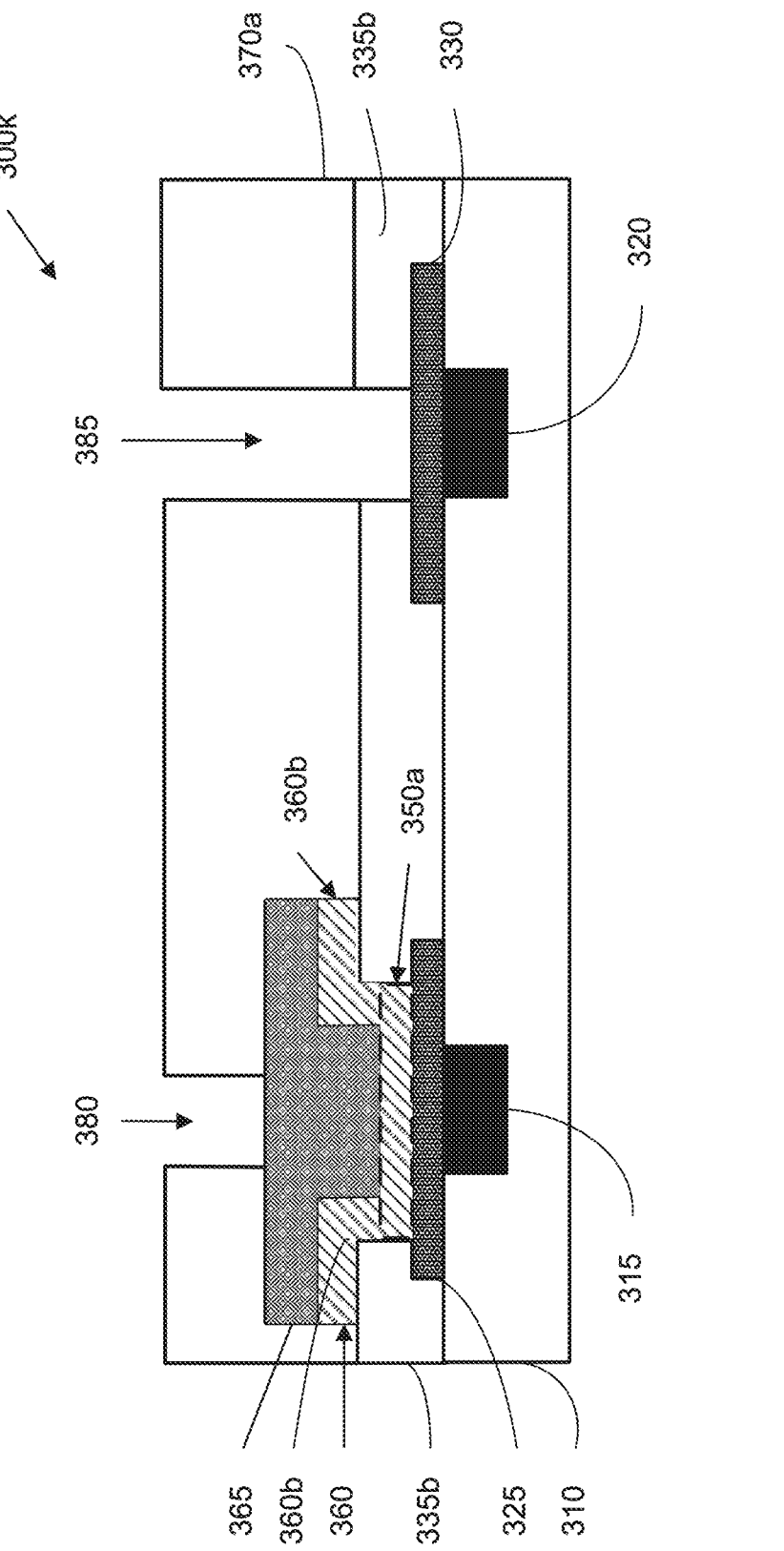

As shown in FIG. 3K, a third via trench 380 may be fabricated to expose one or more portions of the top electrode 365. A fourth via trench 385 may be fabricated to expose one or more portions of the second bottom electrode 330. Fabricating the third via trench 380 may involve selectively removing (etching) one or more portions of the isolation layer 370 shown in FIG. 3J. Fabricating the fourth via trench 385 may involve selectively removing (e.g., etching) one or more portions of the isolation layer 370 and the first isolation layer 335a. As illustrated, the via trench 385 is positioned in the remaining portion of the isolation layer 370 (referred to herein as the isolation layer 370a) and the remaining portion of the isolation layer 335a (referred to herein as the isolation layer 335b).

Figure 3L:
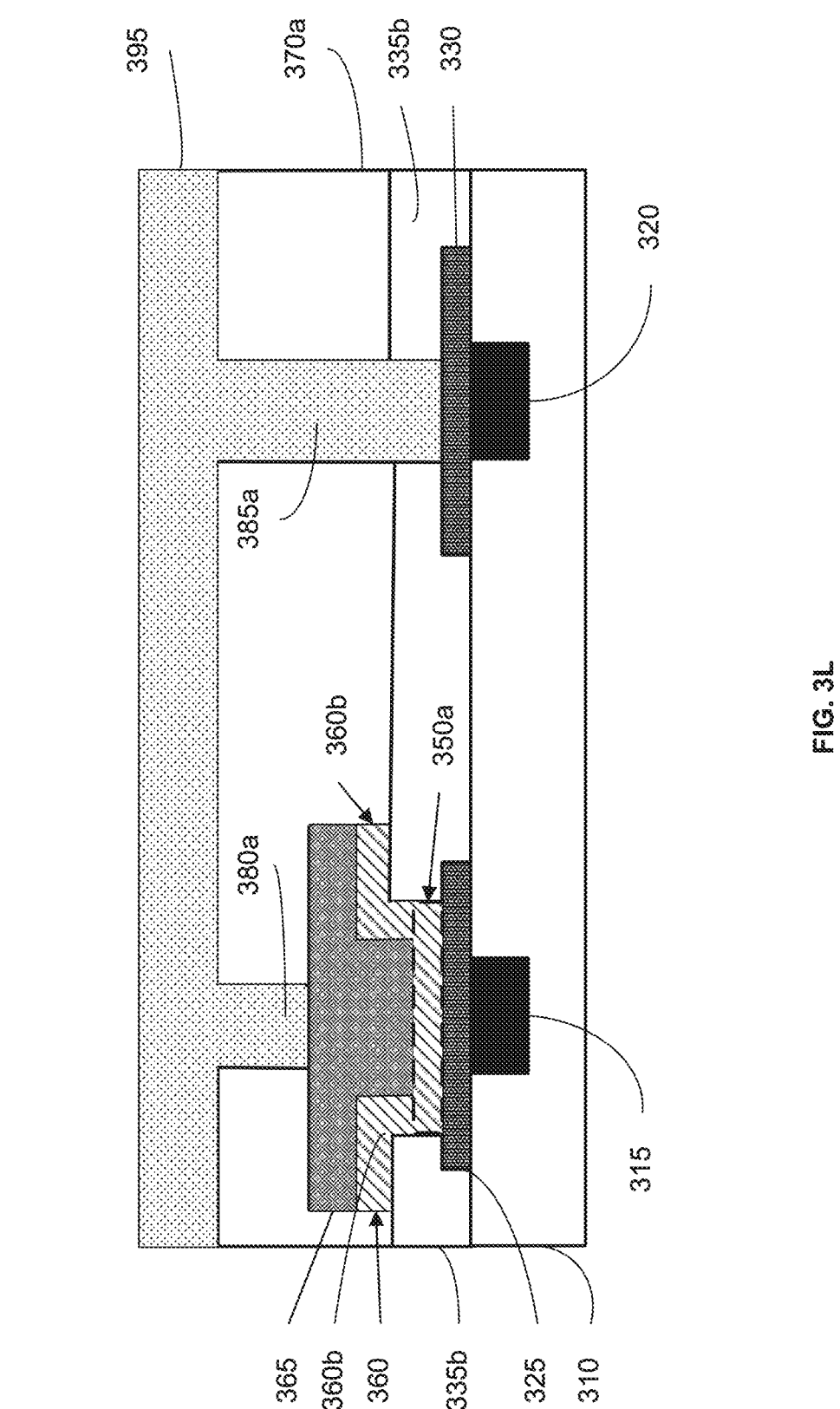

As shown in FIG. 3L, a metal layer 395 may be fabricated on the isolation layer portion 370a. The fabrication of the metal layer 395 may involve fabricating a via 380a (also referred to as the "third via") and a via 385a (also referred to as the "fourth via") by filling the third via trench 380 shown in FIG. 3K and the fourth via trench 385, shown in FIG. 3K using a conductive material, respectively. In some embodiments, the via 380a, the via 385a, and the metal layer 395 may include an alloy comprising Al and Cu.

Figure 3M:
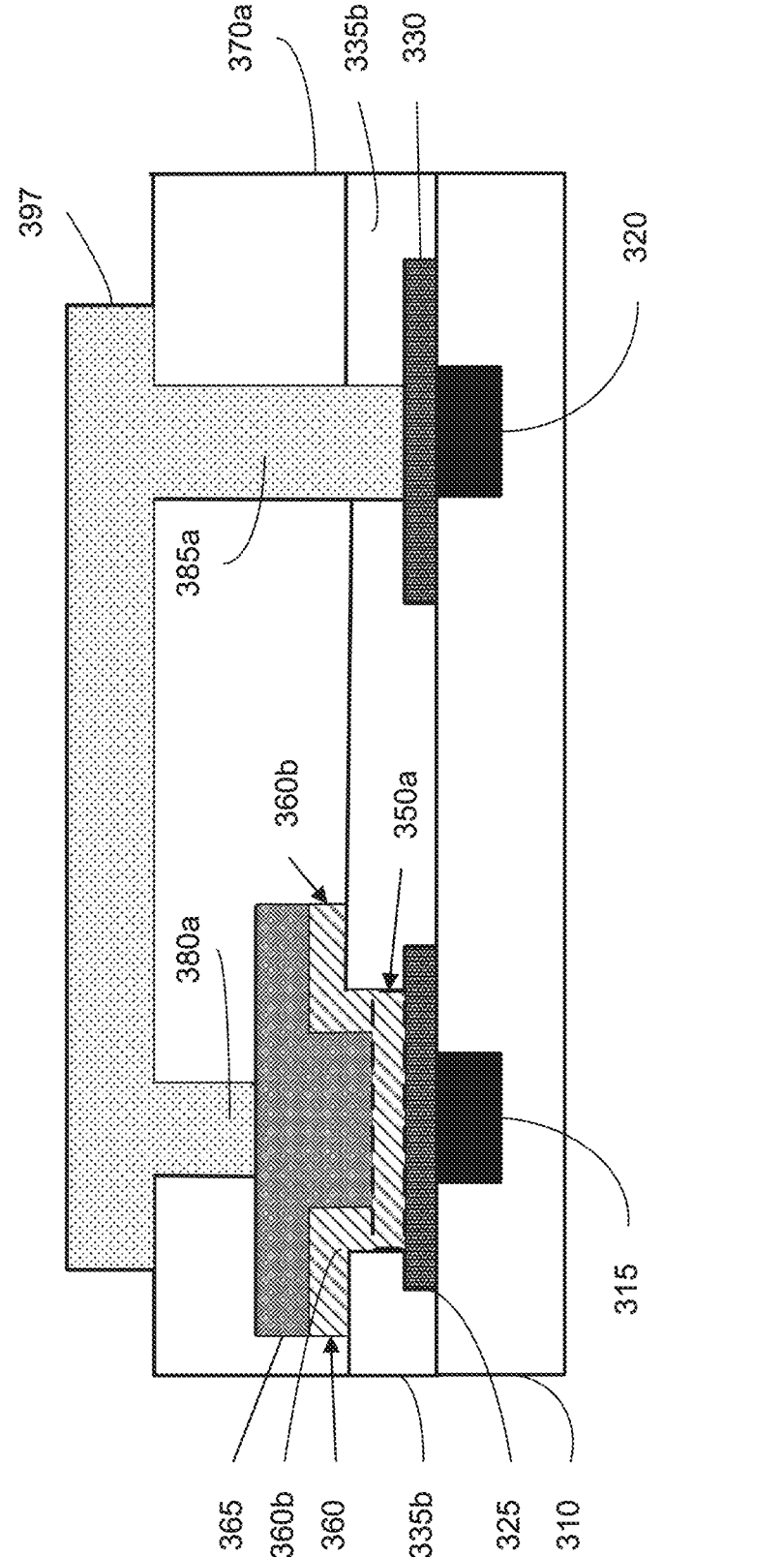

Referring to FIG. 3M, one or more portions of the metal layer 395 shown in FIG. 3L may be selectively removed to fabricate a top metal interconnect 397. For example, one or more portions of the metal layer 395 that are fabricated on the isolation layer 370a may be selectively removed (e.g., etched). The vias 380a and 385a are not etched or otherwise modified during the fabrication of the top metal interconnect 397. The top metal interconnect 397 may directly contact the via 380a and the via 385a.

As shown in FIG. 3M, the RRAM device 300 may include the first bottom electrode 325 and the second bottom electrode 330 that are fabricated on the substrate 310. More particularly, the first bottom electrode 325 and the second bottom electrode 330 are fabricated on the first metal plug 315 and the second metal plug 320 embedded in the substrate 310, respectively. The RRAM device 300 further includes the filament-forming layer 360 fabricated on the first bottom electrode 325 and the isolation layer 335b (also referred to as the first isolation layer) and the top electrode 365 fabricated on the filament-forming layer 360. The RRAM device 300 further includes the top metal interconnect 397 fabricated on the top electrode 365 and the isolation layer 370a. The RRAM device 300 further includes the third via 380a and the fourth via 385a. The via 380a may connect the top metal interconnect 397 and the top electrode 365. The via 385a may connect the top metal interconnect 397 and the second bottom electrode 330. In some embodiments, the via 380a and the via 385a may be regarded as being part of the top metal interconnect 397.

A first portion 360b of the filament-forming layer 360 is fabricated on the top surface of the first isolation layer 335b. A second portion 350a of the filament-forming layer is fabricated on the first bottom electrode 325. As described above in connection with FIG. 3E, the second portion of the filament-forming layer is fabricated on the via bottom of the first via 340. The via bottom of the first via 340 directly contacts the portion 325 of the first bottom electrode 325, as shown in FIG. 3E. The first portion 360b of the filament-forming layer 360 does not contact the portion 325a or the other portion of the first bottom electrode 325.

The RRAM device 300 may have an initial resistance after it is fabricated. The initial resistance of RRAM device 300 may be changed and RRAM device 300 may be switched to a state of a lower resistance via a forming process. During the forming process, a suitable voltage or current may be applied to the RRAM device 300. The application of the voltage to RRAM device 300a may induce the metallic material(s) in the top electrode 365 to absorb oxygen from the portion 350a of the filament-forming layer 360 and create oxygen vacancies in the filament-forming region 350a. As a result, a conductive channel (e.g., a filament) which is oxygen vacancy rich may form in the portion 350a. The first portion 360b of the filament-forming layer 360 does not contact the first bottom electrode 325 and is thus not subject to an electric field during the forming process. Only the portion 350a of the filament forming layer 360 that contacts the bottom electric is between the top electrode and the bottom electrode and is subject to an electric field during the operation of the RRAM device 300. As such, the portion 350a is referred to herein as the "filament-forming region." The RRAM device 300 may be reset to a high-resistance state by applying a reset signal (e.g., a voltage signal or a current signal) to the RRAM device 300. The application of the reset signal may cause oxygen to drift back to the filament-forming region 350a of the filament-forming layer 360 and recombine with one or more of the oxygen vacancies. For example, an interrupted conductive channel (not shown) may be formed in the filament-forming region 350a of the filament-forming layer 360 during the reset process. The conductive channel may be interrupted with a gap which may be oxygen vacancy poor locally between the interrupted conductive channel and the first bottom electrode 325. The first portion 360b of the filament-forming layer 360 does not contact the first bottom electrode 325 and is thus not subject to an electric field between the top electrode 365 and the first bottom electrode 325 during the reset process. The RRAM device 300 may be electrically switched between the high-resistance state and the low-resistance state by applying suitable programming signals (e.g., voltage signals, current signals, etc.) to the RRAM device 300.

In some embodiments, the first metal plug 315 may be connected to the drain of transistor (e.g., transistor terminal D of FIG. 2), the second metal plug 320 may be connected to the bitline (e.g., the bitline 211 of FIG. 2). The gate and the source of the transistor may be connected to a select line and a wordline of the crossbar circuit, respectively.

Figure 4:
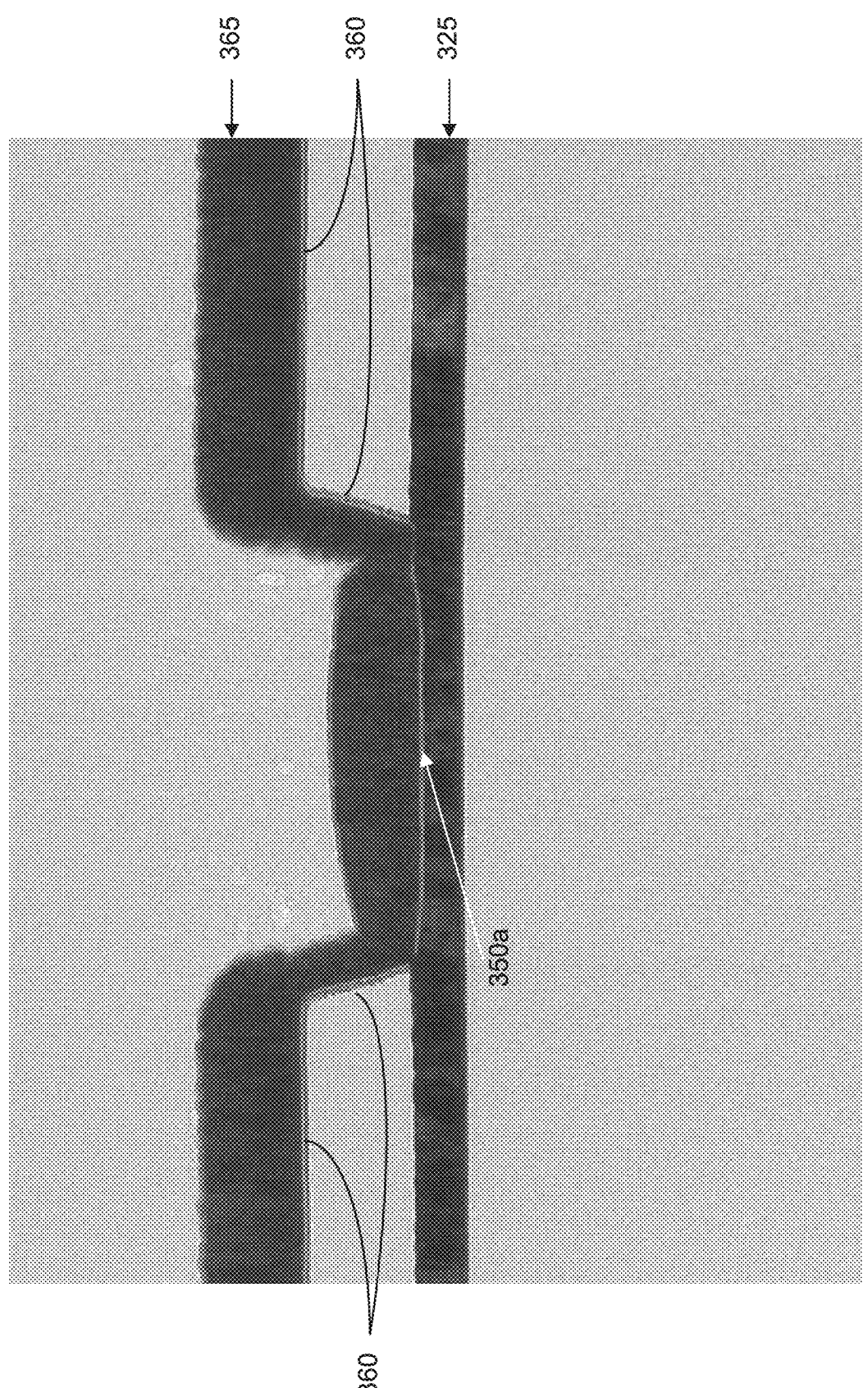
FIG. 4 shows a transmission electron microscope (TEM) image of an RRAM device in accordance with some embodiments of the present disclosure.

FIG. 4 shows a transmission electron microscope (TEM) image of an RRAM stack in accordance with some embodiments of the present disclosure. As shown, a bottom electrode is fabricated on the substrate. A first isolation layer is fabricated on the bottom electrode and the substrate and a via is formed. A switch oxide layer is conformably deposited on the exposed portion of the bottom electrode, on the sidewall of the via, and on the top surface of the first isolation layer. As illustrated in FIG. 4, only the portion 350a of the filament-forming layer contacts the exposed portion of bottom electrode while the metal oxides on the via sidewall and on the first isolation layer do not contact the bottom electrode and do not switch as they do not subject to an electrode field during device operation. The switching oxide 360 is an ultra-thin layer. The filament-forming region 350a directly contacts the first bottom electrode 325. The other portions of the filament-forming layer 360 (e.g., portion 360b) do not contact the first bottom electrode 325. The top electrode 365 is conformally fabricated on the filament-forming layer 360.

Figure 5A:
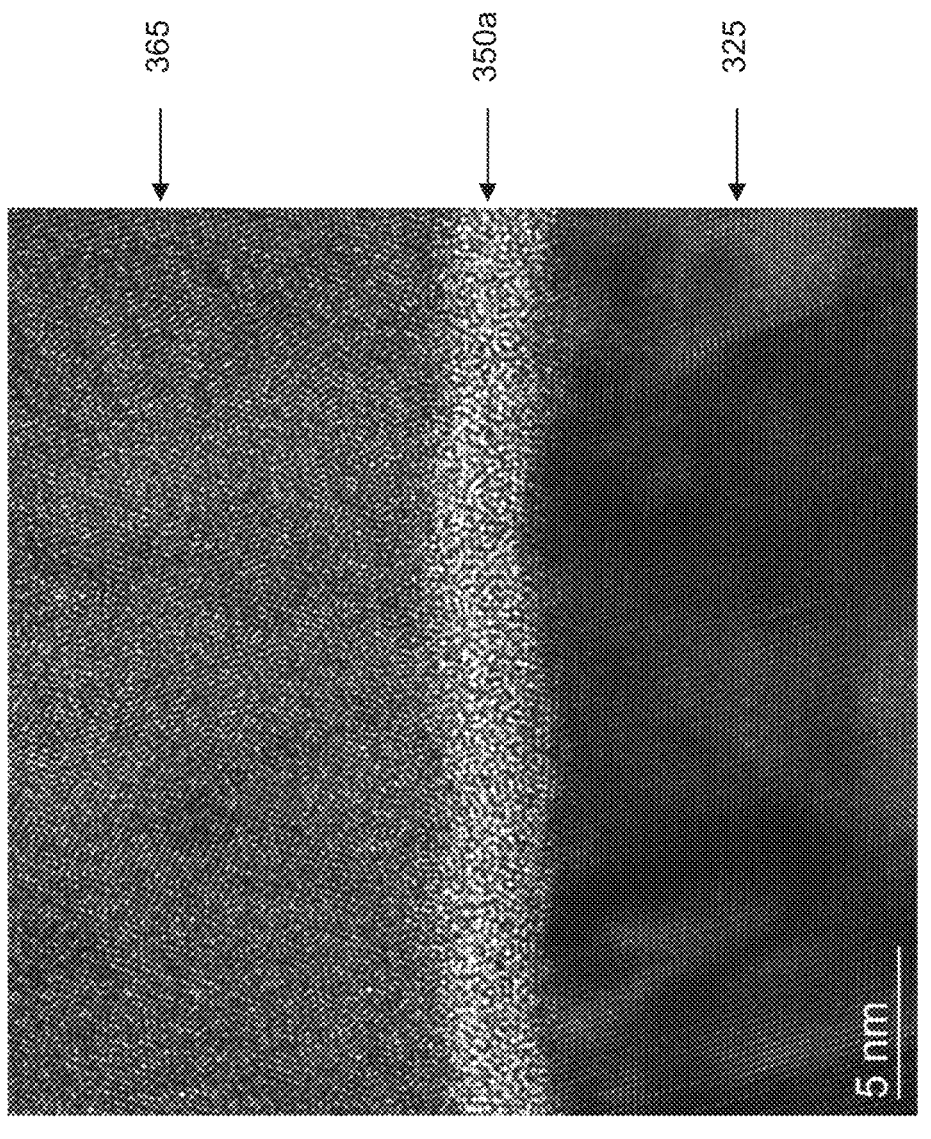
FIGS. 5A-5B shows TEM images of an RRAM device in accordance with some embodiments of the present disclosure.
Figure 5B:
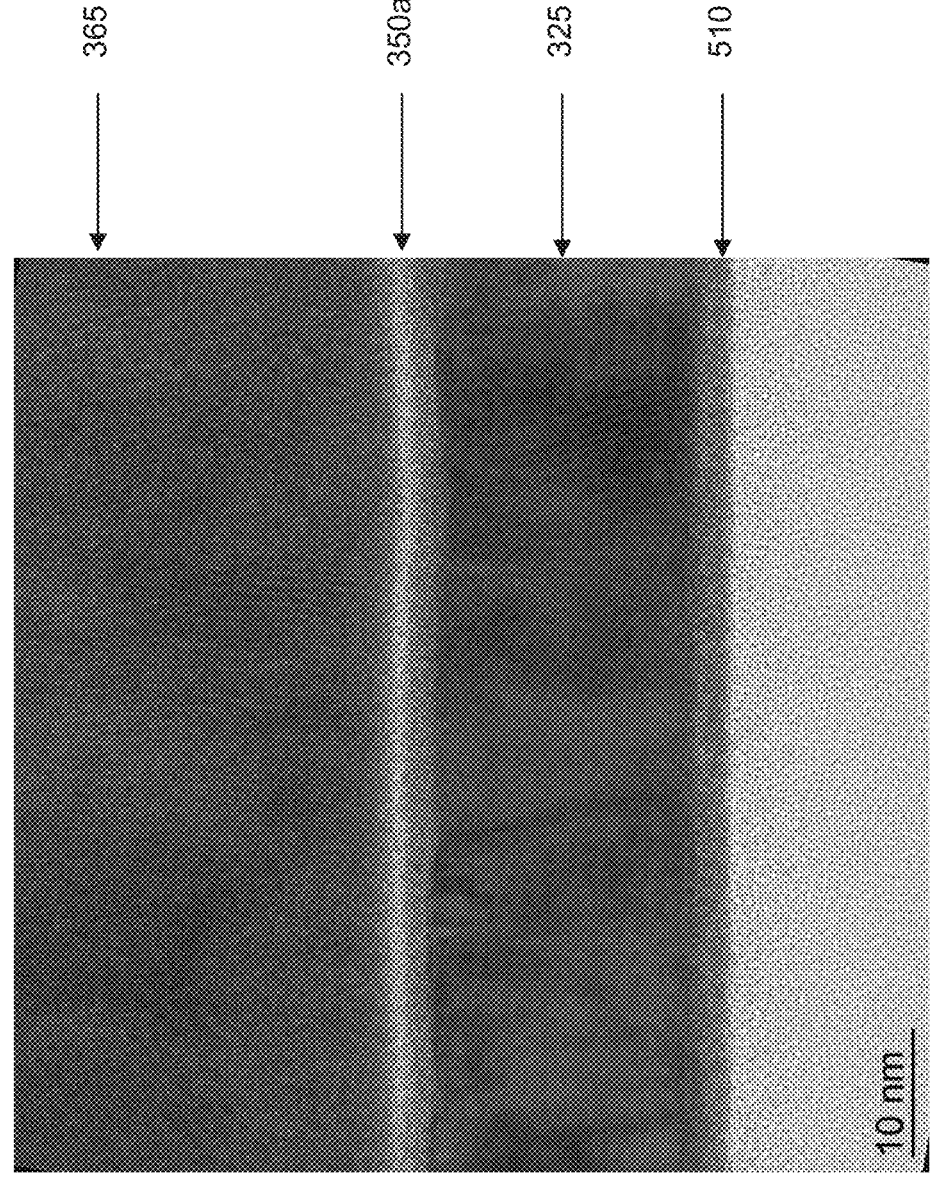

FIGS. 5A and 5B shows TEM images of RRAM devices in accordance with the present disclosure. As shown, the filament-forming region 350a is a thin-film deposition of the switching metal oxide with a uniform or substantially uniform thickness. The thickness of the filament-forming region 350a may be about or less than 2 nm. As shown in FIG. 5B, the RRAM device may further include a layer 510 of one or more metals that may enhance adhesion between the first bottom electrode 325 and the first metal plug 315, adhesion of the second bottom electrode 330 to the second metal plug 320, and/or adhesion of the first bottom electrode 325 and the second bottom electrode 330 to substrate 310, such as Ta, Ti, etc.

FIG. 6A shows an image of a crossbar circuit 600 including an array of RRAM devices 610 in accordance with some embodiments of the present disclosure and an image of an enlarged view of a portion of the crossbar circuit 600. The array of RRAM devices 610 may include an RRAM device 620. The RRAM device 620 may be and/or include the RRAM device 300 as described above. As shown, RRAM device 620 may include an RRAM stack 625 including a bottom electrode 631 (corresponding to the first bottom electrode 325 of RRAM device 300), an RRAM cell including switching metal oxide(s) 633 (corresponding to the filament-forming layer 360 of RRAM device 300), a top electrode 635 (corresponding to the top electrode 365 of RRAM device 300), and a top electrode interconnect 637 (corresponding to the top metal interconnect 397 of RRAM device 300). The RRAM device 620 may further include a bottom electrode 623 (corresponding to the second bottom electrode 330 of RRAM device 300). The X-direction and the Y-direction marks shown in FIG. 6A illustrate the X-direction and the Y-direction for the cross-section views shown in FIGS. 7A-7B, respectively.

FIG. 6B is an image of an enlarged SEM tilted top view of the RRAM stack 625. Using a tilted SEM beam, an image may show topographic information of a surface, such as depth or sidewalls. However, it should also be pointed out that tilted SEM beams may cause dimensional change in an image, for example, a squared pad becomes a rectangular pad, a circular via becomes an oval via, etc. As shown, the RRAM stack 625 may include a bottom electrode contact 631, an RRAM cell 633, and a top electrode contact 635. FIG. 6C shows an image of an enlarged SEM tilted top view of the second bottom electrode 330 on the second metal plug 320. The second bottom electrode 330 may be smaller than the first bottom electrode 325 in size since RRAM cell may be fabricated on the first bottom electrode 325, not on the second bottom electrode 330. FIG. 6D shows an image of an enlarged SEM tilted top view of the RRAM cell 633. The bottom electrode contact 631 may include the first bottom electrode 325 and the first metal plug 315 as shown in FIG. 3L. The RRAM cell 633 may include the filament-forming region 350a. The top electrode contact 635 may include the top electrode 365. As shown in FIG. 6B, the first bottom electrode 325 and the RRAM cell 633 are not centrally aligned, or not in the same plane in the Y-direction. Such off-center design may further enhance the performance uniformity of the RRAM device described herein. In particular, as shown in FIG. 6B, the portion of the first bottom electrode 631 that contacts the first metal plug 315 may present surface roughness. Since the first metal plug 315 is not centrally aligned with the RRAM cell 633, the RRAM cell 633 is not fabricated on the portion of the first bottom electrode 325 that contacts the first metal plug 315 nor is affected by the imperfection of the portion of the first bottom electrode 325. Such an off-center design may avoid the variation caused by the surface roughness from the first metal plug 315 and may improve the performance uniformity of the RRAM devices in the crossbar circuit. For example, as shown in FIGS. 8A-8C, the IV curves of chips (RRAM devices) 801, 803, 805, 807, 809 that are located in different portions of a wafer 800 are identical or substantially identical, indicating the uniformity of the RRAM devices of the crossbar circuit.

Figure 7A:
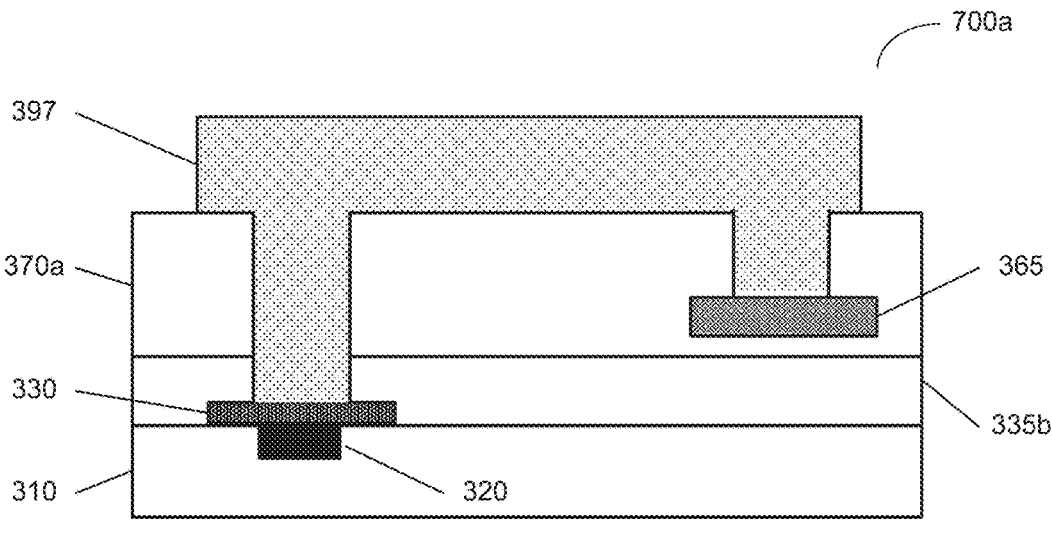
FIGS. 7A and 7B are schematic diagrams illustrating cross-sectional representations an RRAM device shown in FIG. 6A in the X-direction and the Y-direction, respectively.
Figure 7B:
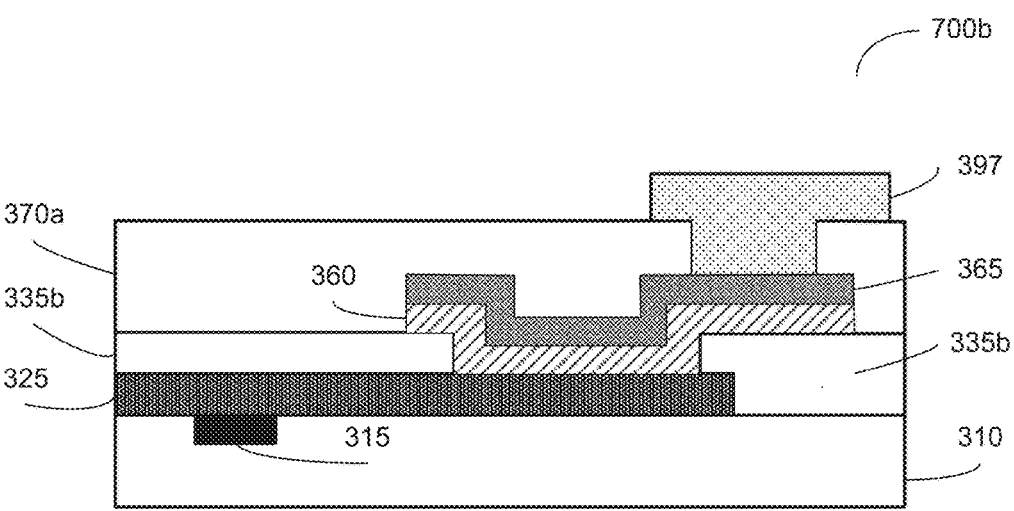

FIGS. 7A and 7B are schematic diagrams illustrating cross-sectional representations 700a and 700b of the RRAM stack 625 shown in FIG. 6A in the X-direction and the Y-direction (shown in FIG. 6A), respectively. The components of the RRAM device 700a and 700b may correspond to their counterparts as described in connection with FIGS. 3A-3M above.

As shown in FIG. 7B, the center of the first metal plug 315 is not aligned to the center of the first bottom electrode 325. As such, the filament-forming layer 360 is not fabricated on the first metal plug 315. This may improve the surface smoothness of the BE contacting the switching oxide layer and improve the performance uniformity of the RRAM device.

Figure 8A:
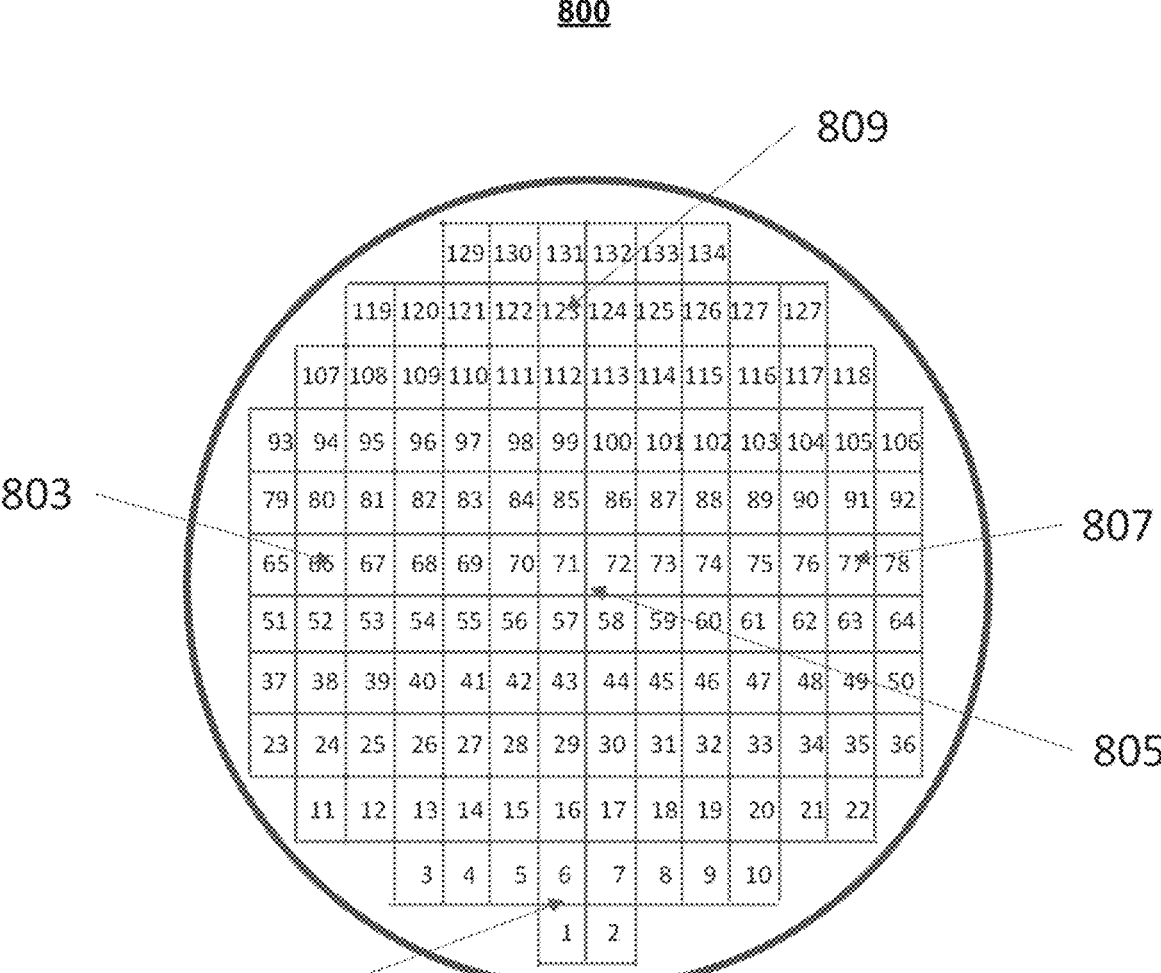
FIGS. 8A-8C show I-V (current-voltage characteristic) curves of RRAM devices of a crossbar array in accordance with some embodiments of the present disclosure.
Figure 8B:
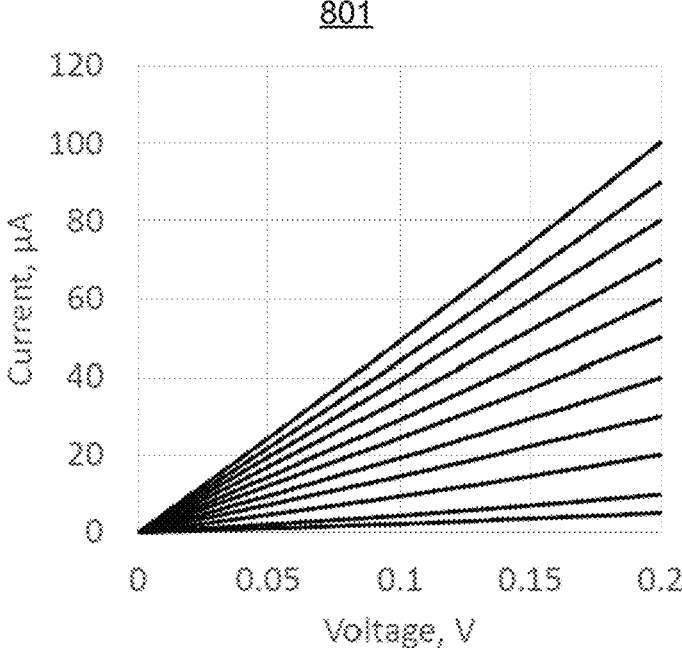
Figure 8B:
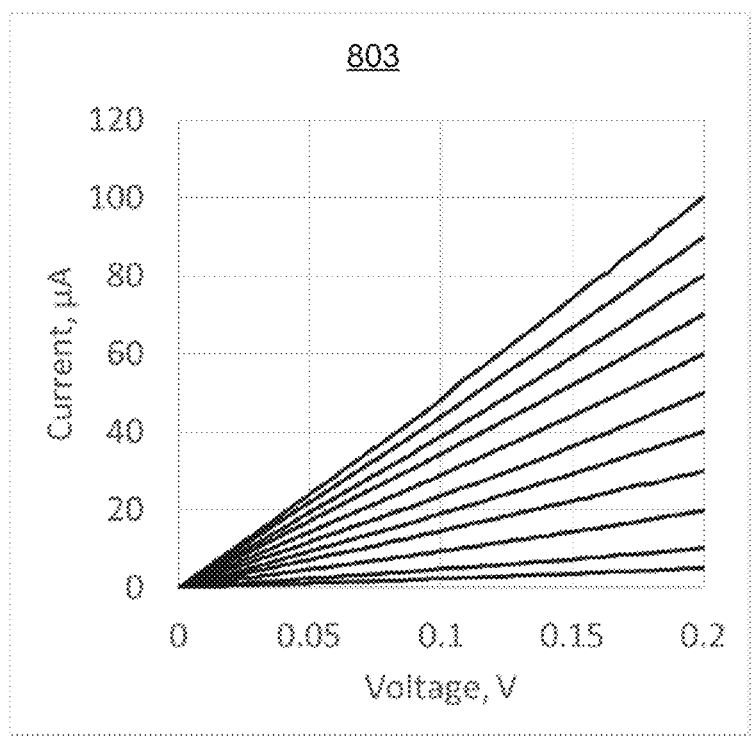
Figure 8C:
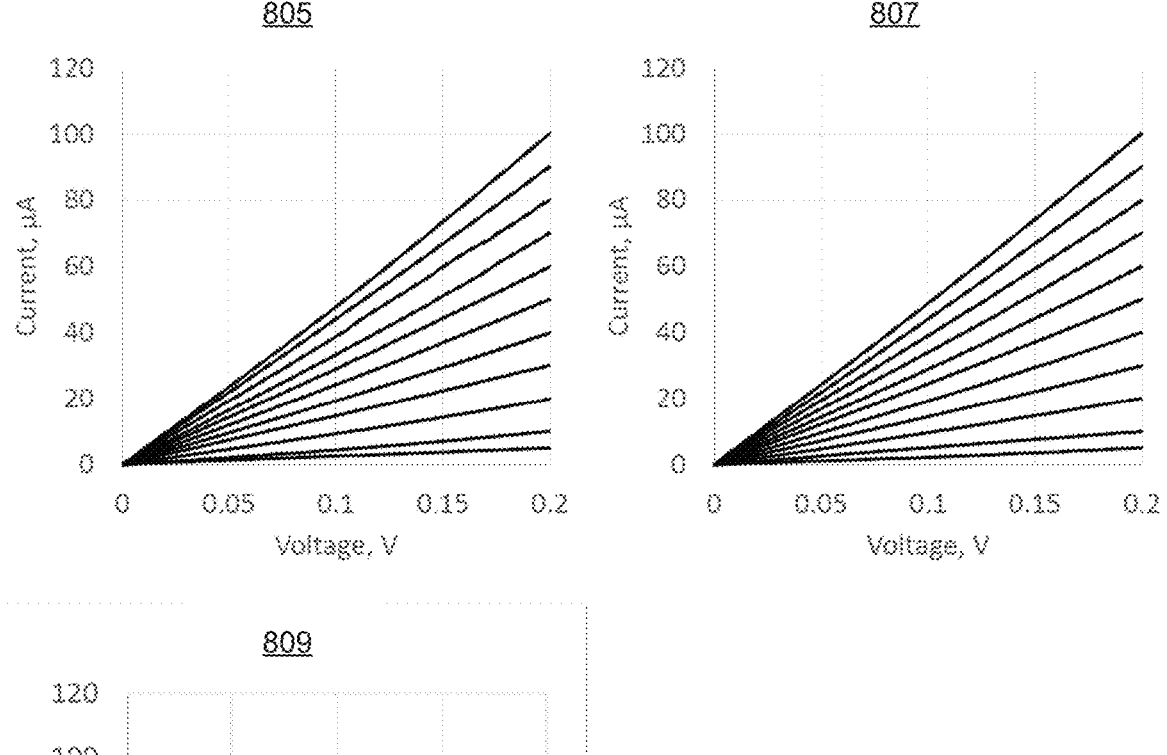

FIG. 8A is a diagram showing a schematic die map of RRAM chips fabricated on a wafer 800. Each chip may contain multiple RRAM arrays, driver circuits, and other electric components (not shown). The chips 801, 803, 805, 807, and 809 were tested for performance variations across the wafer. As show in FIGS. 8B-8C, the chips showed good uniformity in I-V (current-voltage) characterizations for multi-level resistances and linearities which are important to in-memory-computing (IMC) applications.

FIG. 9 is a flowchart illustrating an example process 900 for fabricating an RRAM device in accordance with some embodiments of the present disclosure.

At 905, a substrate with a first metal plug and a second metal plug may be provided. The substrate may include the first metal plug and the second metal plug fabricated in a first opening and a second opening, respectively. The first opening and the second opening do not overlap with each other in some embodiments. In some embodiments, providing the substrate may involve fabricating the first opening and the second opening in the substrate. Providing the substrate may further involve fabricating the first metal plug and the second metal plug on the substrate. For example, fabricating the first metal plug may involve depositing a suitable metal (e.g., W) in the first opening of the substrate. As another example, fabricating the second metal plug may involve depositing a suitable metal (e.g., W) in the second opening of the substrate. As mentioned previously, the first metal plug and the second metal plug may also be fabricated as part of top metal interconnect in a CMOS process where diodes, transistors, integrated circuits, driver circuits, interconnects, etc. are fabricated.

At 910, a first bottom electrode and a second bottom electrode may be fabricated on the substrate. For example, the first bottom electrode and the second bottom electrode may be fabricated on the first metal plug and the second metal plug, respectively. Fabricating the first bottom electrode may involve depositing, on the first metal plug, one or more suitable conductive and non-reactive materials to form an ohmic contact. Fabricating the second bottom electrode may involve depositing, on the second metal plug, one or more suitable conductive and non-reactive materials to form an ohmic contact. The first bottom electrode may be larger than the second bottom electrode since a via device may be fabricated on the first bottom electrode, and the via device may be off-center to the first metal plug. Examples of the conductive and non-reactive materials may include Pt, Pd, Ir, TiN, TaN, etc. The first bottom electrode and the second bottom electrode may or may not include the same material. In some embodiments, the first bottom electrode and/or the second bottom electrode may be fabricated utilizing in situ sputter deposition techniques.

In some embodiments, fabricating the first bottom electrode and/or the second bottom electrode may involve depositing one or more thin metallic materials on the first metal plug, the second metal plug, and the surface of the first isolation materials that may enhance the adhesion of the first bottom electrode and the second bottom electrode on them, such as Ta, Ti, etc.

At 915, a first isolation layer may be fabricated on the substrate, the first bottom electrode, and the second bottom electrode. Fabricating the first isolation layer may involve depositing one or more suitable materials that may be used as an inter-layer dielectric for fabricating one or more components of the RRAM device. As an example, fabricating the first isolation layer may involve depositing a layer of $SiO_2$. In some embodiments, the ILD material may be deposited over the entire top surface of the substrate.

At 920, a first via may be fabricated in the first isolation layer to expose at least a portion of the first bottom electrode. For example, one or more portions of the first isolation layer may be selectively removed by patterning and etching the first isolation layer. The fabrication of the first via may expose one or more portions of the first bottom electrode. Upon the fabrication of the first via, the remaining portion of the first isolation layer may be continuous surrounding the first via. The size of the first via and/or the exposed portion(s) of the first bottom electrode may define the cell size of the RRAM device to be fabricated. In some embodiments, a dimension (e.g., a diameter) of the first via 340 may be about or less than 1 μm.

At 925, a switching oxide layer may be fabricated on the first isolation layer, the first via, and the first bottom electrode. For example, fabricating the switching oxide layer may involve depositing one or more switching metal oxides, such as $TaO_x$, $HfO_x$, $TiO_x$, $NbO_x$, $ZrO_x$, etc. The switching oxide layer may be deposited utilizing an atomic layer deposition (ALD) technique, physical vapor deposition (PVD) technique, chemical vapor deposition (CVD) technique, and/or any other suitable deposition technique. In some embodiments, the switching oxide layer may be fabricated utilizing bottom anti-reflective coatings (BARC) and/or deep UV (DUV) lithography techniques.

In some embodiments, fabricating the switching oxide layer may further include deposit one or more interface layers below and/or above the layer of switching metal oxides. The interface layers may be continuous or non-continuous. The interface layers may include one or more layers of $AlO_3$.

The switching oxide layer may be conformally fabricated on the remaining portion of the first isolation layer that surrounding the first via, sidewalls of the first via, and the exposed portion(s) of the first bottom electrode. Fabricating the switching oxide layer may involve fabricating a filament-forming region in the first via by depositing the switching oxide(s) on the exposed portion(s) of the first bottom electrode. The fabrication of the filament-forming region may partially fill the first via. Fabricating the switching oxide layer may further involve depositing the switching oxide(s) on a top surface of the first isolation layer.

At 930, a top electrode layer may be fabricated on the switching oxide layer. For example, fabricating the top electrode layer may involve depositing one or more suitable metallic materials that are electrically conductive and reactive to the switching oxide in the switching oxide layer, such as Ta, Hf, Ti, TiN, TaN, etc. The top electrode layer may be fabricated on the switching oxide layer and along the sidewalls of the second via. Fabricating the top electrode layer may involve filling the second via by depositing the metallic materials. Fabricating the top electrode layer may further involve depositing the metallic materials on the portions of the switching oxide layer that extend beyond the first via and the second via. In some embodiments, the top electrode layer may be fabricated utilizing in situ pre-sputtering etching techniques.

At 935, a filament-forming layer and a top electrode may be fabricated. For example, the top electrode layer may be patterned and portions of the top electrode layer and the switching oxide layer that extend beyond the first via and the second via may be etched to form the filament-forming layer and the top electrode layer, respectively.

In some embodiments, fabricating the filament-forming layer and the top electrode may involve performing operations 937 and 939. At 937, a filament-forming layer may be fabricated by etching one or more portions of the switching oxide layer. For example, the first portion of the switching oxide layer may be etched to form the filament-forming layer. The filament-forming region is not etched or otherwise modified during the fabrication of the filament-forming layer and the top electrode. At 939, a top electrode may be fabricated by etching one or more portions of the top electrode layer. For example, the first portion of the top electrode layer may be etched to fabricate the top electrode. In some embodiments, 937 and 939 may be performed sequentially, simultaneously, or substantially simultaneously.

At 940, a second isolation layer may be fabricated on the first isolation layer and the top electrode. Fabricating the second isolation layer may involve depositing one or more suitable materials that may be used as an interlayer dielectric (ILD) for fabricating one or more components of the RRAM device. As an example, fabricating the second isolation layer may involve depositing a layer of $SiO_2$. The ILD material may be deposited on the top surface of the first isolation layer and the top surface of the top electrode, and along the sidewalls of the filament-forming layer and the top electrode.

At 945, a top metal interconnect may be fabricated on the second isolation layer. For example, a suitable conductive material (e.g., an Al—Cu alloy) may be deposited on the second isolation layer. In some embodiments, fabricating the top metal interconnect may involve performing one or more operations depicted in FIG. 10.

FIG. 10 is a flowchart illustrating an example process 1000 for fabricating a top metal of an RRAM device in accordance with some embodiments of the present disclosure.

At 1010, a first via trench is fabricated to expose one or more portions of the top electrode. For example, the second isolation layer may be patterned and etched to expose the one or more portions of the top electrode.

At 1020, a second via trench may be formed to expose one or more portions of the second bottom electrode. For example, one or more portions of the second isolation layer and the first isolation layer may be selected removed (e.g., etched) to expose one or more portions of the second bottom electrode. In some embodiments, blocks 1010 and 1020 may be performed simultaneously in the same step.

At 1030, a first conductive material may be deposited in the first via trench. The first conductive material may include an Al—Cu alloy in some embodiments. The via fabricated in the first via trench is referred to as the "third via."

At 1040, a second conductive material may be deposited in the second via trench. The second conductive material may include an Al—Cu alloy in some embodiments. The via fabricated in the second via trench is referred to as the "fourth via." In some embodiments, blocks 1030 and 1040 may be performed simultaneously in one step.

At 1050, a top metal layer may be fabricated on the second isolation layer, the third via, and the fourth via. For example, one or more layers of a conductive material (e.g., an Al—Cu alloy) may be deposited on the third via, the fourth via, and the second isolation layer. The top metal layer may be a continuous layer of the conductive material and may contact the third via and the fourth via.

At 1060, one or portions of the top metal layer may be removed to fabricate the top metal interconnect. For example, a first portion and a second portion of the top metal layer that do not contact the third via or the fourth via may be patterned and etched to fabricate the top metal interconnect. The third via and the fourth via are not etched or otherwise modified during the fabrication of the top metal interconnect.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. In some embodiments, an etched surface and/or sidewall of the RRAM device may be cleaned prior to further processing.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A resistive random-access memory (RRAM) device, comprising:
   a first bottom electrode fabricated on a substrate;
   a first isolation layer fabricated on the substrate and the first bottom electrode, wherein the first isolation layer includes a first via, wherein a via bottom of the first via contacts the first bottom electrode;
   a filament-forming layer fabricated on the first bottom electrode and the first isolation layer and within the first via, wherein the filament-forming layer comprises at least one switching metal oxide, wherein a first portion of the filament-forming layer is fabricated on a top surface of the first isolation layer and along sidewalls of the first via, wherein a second portion of the filament-forming layer is fabricated within the first via and contacts the first bottom electrode at the via bottom of the first via, and wherein the first portion of the filament-forming layer does not contact the first bottom electrode; and
   a top electrode fabricated on the filament-forming layer.

2. The RRAM device of claim 1, further comprising:
   a second bottom electrode; and
   a top metal interconnect coupled to the top electrode and the second bottom electrode.

3. The RRAM device of claim 2, wherein a first portion of the top electrode is fabricated in a second via, wherein a second portion of the top electrode extends beyond the second via, and wherein the RRAM device further comprises:
   a third via connecting the top metal interconnect and the top electrode; and
   a fourth via connecting the top metal interconnect and the second bottom electrode.

4. The RRAM device of claim 3, further comprising a second isolation layer fabricated on the top electrode and the first isolation layer, wherein the second isolation layer comprises $SiO_2$.

5. The RRAM device of claim 1, wherein the switching metal oxide comprises at least one of $HfO_x$, $TaO_x$, $TiO_x$, $NbO_x$, or $ZrO_x$.

6. The RRAM device of claim 1, wherein a filament is formed within the second portion of the filament-forming layer in response to a voltage applied to the RRAM device.

7. The RRAM device of claim 1, wherein the first bottom electrode is fabricated on a first metal plug, and wherein a center of the first metal plug is not aligned with the filament-forming layer.

8. The RRAM device of claim 1, wherein the first isolation layer comprises $SiO_2$.

9. The RRAM device of claim 1, wherein the first bottom electrode comprises at least one of platinum (Pt), palladium (Pd), iridium (Ir), titanium nitride (TiN), or tantalum nitride (TaN).

10. The RRAM device of claim 9, wherein the first bottom electrode further comprises at least a layer of tantalum (Ta) or a layer of Titanium (Ti).

11. The RRAM device of claim 1, wherein a cell size of the RRAM device is defined by dimensions of the first via in the first isolation layer.

12. A method for fabricating an RRAM device, comprising:

fabricating a first bottom electrode and a second bottom electrode on a substrate;

fabricating a first isolation layer on the substrate, the first bottom electrode, and the second bottom electrode;

fabricating a first via in the first isolation layer to expose a portion of the first bottom electrode;

fabricating a switching oxide layer by conformally depositing at least one metal oxide on the first isolation layer, along sidewalls of the first via, and on the exposed portion of the first bottom electrode, wherein a first portion of the switching oxide layer is fabricated on a top surface of the first isolation layer, and wherein a second portion of the switching oxide layer is fabricated on and contacts the exposed portion of the first bottom electrode; and fabricating a filament-forming layer by etching the first portion of the switching oxide layer.

13. The method of claim 12, wherein the second portion of the switching oxide layer is not etched during the fabricating of the filament-forming layer.

14. The method of claim 12, further comprising:

fabricating a top electrode layer on the switching oxide layer; and fabricating a top electrode by etching a first portion of the top electrode layer, wherein the first portion of the top electrode layer is fabricated on the first portion of the switching oxide layer, and wherein the first portion of the top electrode layer does not contact the second portion of the switching oxide layer.

15. The method of claim 14, further comprising:

fabricating a second isolation layer on the first isolation layer and the top electrode; and fabricating a top metal interconnect on the second isolation layer, wherein the top metal interconnect comprises a via that connects the top metal interconnect and the top electrode and a via that connects the top metal interconnect and the second bottom electrode.

16. The method of claim 15, wherein fabricating the top metal interconnect comprises:

fabricating a first via trench to expose at least a portion of the top electrode; and depositing a first conductive material in the first via trench.

17. The method of claim 16, wherein fabricating the top metal interconnect further comprises:

fabricating a second via trench to expose at least a portion of the second bottom electrode; and depositing a second conductive material in the second via trench.

18. The method of claim 17, wherein fabricating the top metal interconnect further comprises:

depositing a metal layer on the second isolation layer and in the second via trench; and removing at least a portion of the metal layer to fabricate the top metal interconnect.

19. The method of claim 12, wherein fabricating the first bottom electrode comprises depositing a layer of at least one of platinum (Pt), palladium (Pd), iridium (Ir), titanium nitride (TiN), or tantalum nitride (TaN).

20. The method of claim 19, wherein fabricating the first bottom electrode further comprises depositing at least a layer of tantalum (Ta) or a layer of Titanium (Ti).

* * * * *